(12) United States Patent
Kobayashi et al.

(10) Patent No.: US 8,922,112 B2
(45) Date of Patent: Dec. 30, 2014

(54) LIGHT EMITTING DEVICE

(75) Inventors: Hidekazu Kobayashi, Azumino (JP); Koji Yasukawa, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 1124 days.

(21) Appl. No.: 12/186,320

(22) Filed: Aug. 5, 2008

(65) Prior Publication Data

US 2009/0051275 A1    Feb. 26, 2009

(30) Foreign Application Priority Data

Aug. 21, 2007    (JP) .................................. 2007-214450

(51) Int. Cl.
| | | |
|---|---|---|
| H01L 33/00 | (2010.01) | |
| H01L 51/52 | (2006.01) | |
| H01L 51/50 | (2006.01) | |
| H01J 63/04 | (2006.01) | |
| H01L 27/32 | (2006.01) | |

(52) U.S. Cl.
CPC ........ H01L 51/5265 (2013.01); H01L 51/5036 (2013.01); H01L 27/3213 (2013.01); H01L 51/5048 (2013.01); H01L 2251/558 (2013.01)
USPC ........................................................ 313/504

(58) Field of Classification Search
USPC ................................................ 313/500–512
See application file for complete search history.

(56) References Cited

U.S. PATENT DOCUMENTS

| | | | |
|---|---|---|---|
| 2004/0195963 A1 | 10/2004 | Choi et al. | |
| 2005/0249972 A1* | 11/2005 | Hatwar et al. | ................. 428/690 |
| 2006/0192220 A1 | 8/2006 | Nishikawa et al. | |
| 2007/0164671 A1* | 7/2007 | Yamazaki et al. | ............. 313/506 |
| 2007/0286944 A1* | 12/2007 | Yokoyama et al. | ............. 427/66 |
| 2009/0051284 A1* | 2/2009 | Cok et al. | ....................... 313/506 |
| 2009/0072730 A1 | 3/2009 | Choi et al. | |
| 2010/0295026 A1 | 11/2010 | Tsuji et al. | |

FOREIGN PATENT DOCUMENTS

| | | |
|---|---|---|
| JP | A-2004-311440 | 11/2004 |
| JP | A-2006-032327 | 2/2006 |
| JP | A-2006-236947 | 9/2006 |
| JP | A-2006-244712 | 9/2006 |
| JP | A-2007-122969 | 5/2007 |
| WO | WO 2007-055186 A1 | 5/2007 |

* cited by examiner

*Primary Examiner* — Anne Hines
*Assistant Examiner* — Jacob R Stern
(74) *Attorney, Agent, or Firm* — Oliff PLC

(57) ABSTRACT

A light emitting element includes a reflective layer disposed in a substrate, a first electrode disposed through the reflective layer, a second electrode having translucent reflectivity, a plurality of organic material layers including a light emitting layer disposed between the first electrode and the second electrode, and a light emitting region defined by the first electrode, the second electrode, and the light emitting layer. A first organic material layer of the plurality of organic material layers has a first layer thickness in a first sub region within the light emitting region and has a second layer thickness, which is different from the first layer thickness, in a second sub region within the light emitting region.

5 Claims, 11 Drawing Sheets

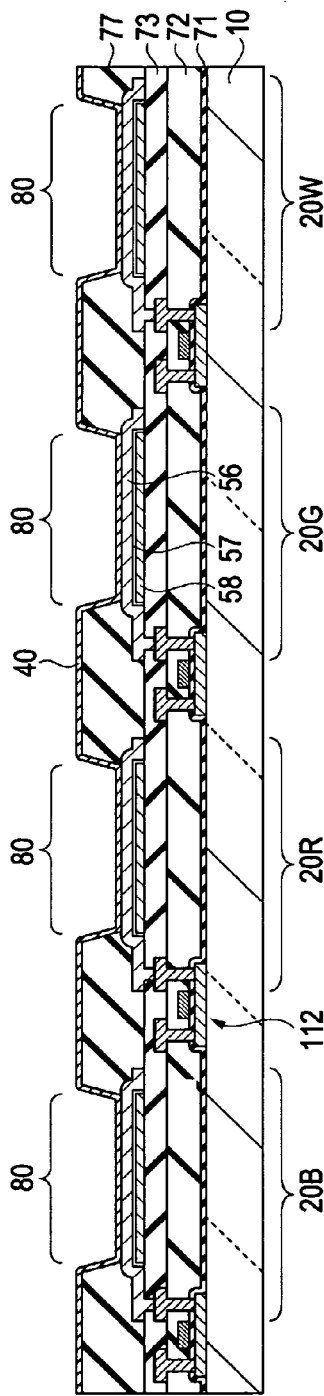
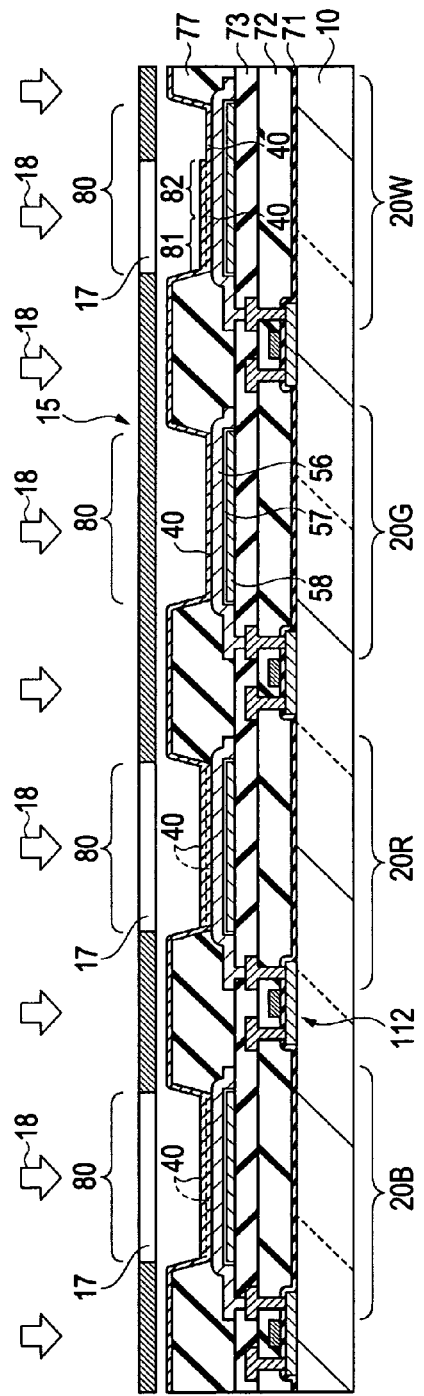
FIG. 9A
FIG. 9B

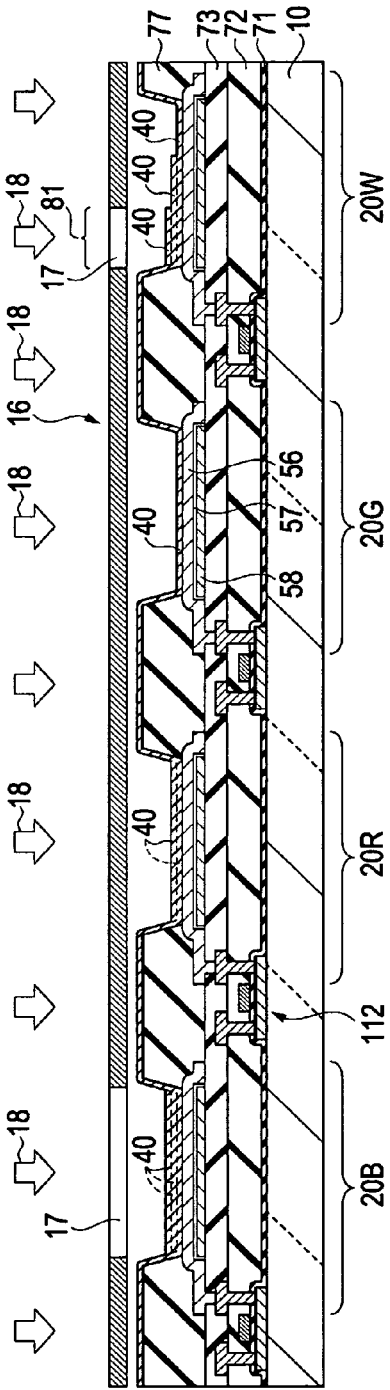
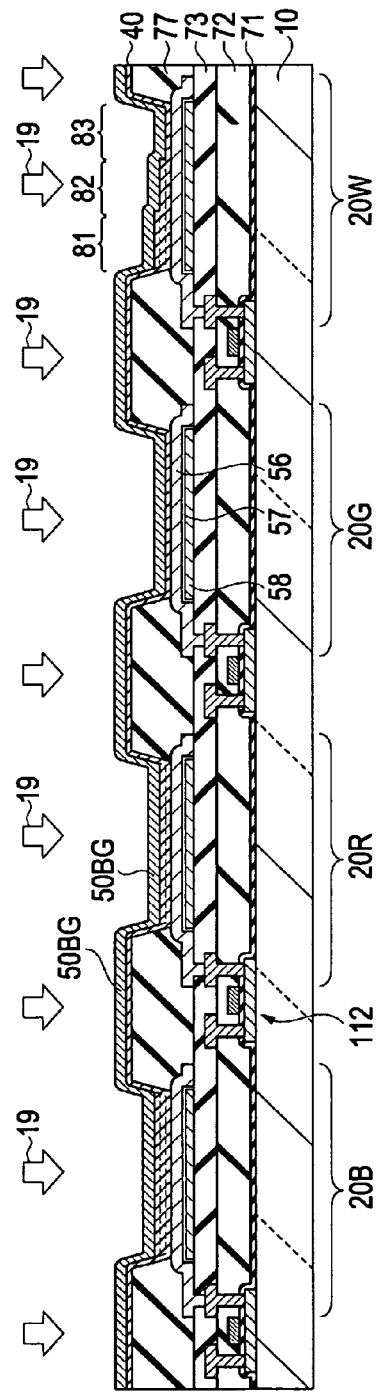
FIG. 10A
FIG. 10B

LIGHT EMITTING DEVICE

BACKGROUND

1. Technical Field

The present invention relates to a light emitting element such as an organic EL element and a light emitting device such as an organic EL device having the light emitting element.

2. Related Art

Recently, as display devices replacing liquid crystal display devices, organic EL (electroluminescence) devices have been developed. In the organic display devices, color display can be performed by regularly disposing organic EL elements each emitting one of three primary colors of red, green, and blue colors. However, when white display is performed by using only the three primary colors, all the organic EL elements corresponding to the three primary colors are configured to emit light. Accordingly, power consumption thereof is increased, and the use life of the organic EL elements decreases. Thus, a method in which color display is performed by using four colors including a white color in addition to the three primary colors has been developed. According to this method, an organic EL element that emits white light is used for white display for which power consumption is the highest of all, and thereby light emission of elements corresponding to other colors can be suppressed. Accordingly, power consumption can be reduced.

Setting a resonant length is important in a case where white light is projected. In the organic EL element, a resonance structure is inevitably formed, and the resonance structure is prominent particularly in a top-emission type element in which a reflective layer is needed in an anode side. Accordingly, light of a specific wavelength is enhanced due to resonance, and it becomes difficult to acquire white light having a low wavelength dispersion property.

Thus, in order to respond to the above-described problem, a method of adjusting a light path length from the reflective layer to a light emission position and a resonant length inside the resonant structure has been reviewed (see JP-A-2006-244712). In addition, a method of changing a layer thickness of a transparent conductive material layer such as ITO constituting the anode of the organic EL element that emits white light has been reviewed (see JP-A-2006-32327).

However, the method disclosed in JP-A-2006-244712 requires a complicated control process, and thus there is a problem in practical implementation. In addition, when the layer thickness of ITO or the like is changed in one element, there is a problem that a manufacturing process thereof is complicated and a manufacturing cost increases.

SUMMARY

An advantage of some aspects of the invention is that it provides an organic EL element and an organic EL device. The invention can be implemented in the following forms or application examples.

According to Application Example 1, there is provided a light emitting element including: a reflective layer disposed in a substrate; a first electrode disposed through the reflective layer; a second electrode having translucent reflectivity; a plurality of organic material layers including a light emitting layer disposed between the first electrode and the second electrode; and a light emitting region defined by the first electrode, the second electrode, and the light emitting layer. A first organic material layer of the plurality of organic material layers has a first layer thickness in a first sub region within the light emitting region and has a second layer thickness, which is different from the first layer thickness, in a second sub region within the light emitting region.

According to the above-described light emitting element, it can be suppressed that only light of a specific wavelength is enhanced by resonance due to a resonance structure formed between the reflective layer and the second electrode. As a result, projected light having a low wavelength dispersion property can be acquired.

According to Application Example 2, in the above-described light emitting element, the first sub region and the second sub region are formed in the shape of a stair.

According to the above-described light emitting element, the first organic material layer can be formed by repeating a local film forming process, and accordingly, projected light having a low wavelength dispersion property can be acquired while suppressing an increase in manufacturing costs.

According to Application Example 3, in the above-described light emitting element, the first organic material layer is a hole injection and transport layer formed between the first electrode and the light emitting layer.

According to the above-described light emitting element, the first organic material layer can be formed by adding a light process to a film forming process for the hole injection and transport layer, and accordingly, projected light having a low wavelength dispersion property can be acquired while suppressing an increase in manufacturing costs.

According to Application Example 4, in the above-described light emitting element, the first organic material layer is an electron injection and transport layer formed between the second electrode and the light emitting layer.

According to the above-described light emitting element, the first organic material layer can be formed by adding a light process to a film forming process for the electron injection and transport layer, and accordingly, projected light having a low wavelength dispersion property can be acquired while suppressing an increase in manufacturing costs.

According to Application Example 5, in the above-described light emitting element, the light emitting layer is formed of a plurality of light emitting material layers that emit light of different wavelengths, and the first organic material layer is a middle layer that is formed between the plurality of light emitting material layers and is formed of an organic material not having a light emitting function.

According to the above-described light emitting element, the first organic material layer can be formed without changing layer thicknesses or the like of other constituent elements, and accordingly, projected light having a low wavelength dispersion property can be acquired without influencing the luminance efficiency or the like.

According to Application Example 6, in the above-described light emitting element, the middle layer has a hole mobility and an electron mobility that are approximately equivalent to each other.

According to the above-described light emitting element, the middle layer can be formed without changing the light emitting characteristic of the light emitting layer, and accordingly, the degree of freedom for setting the layer thickness of the middle layer is improved, and thereby projected light having a low wavelength dispersion property can be acquired in an easy manner.

According to Application Example 7, in the above-described light emitting element, the middle layer has any one mobility between the hole mobility and the electron mobility that is higher than the other mobility.

According to the above-described light emitting element, a difference between the light emitting material layers constituting the light emitting layer can be formed, and accordingly, an effect of enhancing light of a specific wavelength and projected light having a lower wavelength dispersion property can be acquired.

According to Application Example 8, in the above-described light emitting element, light projected from the light emitting element is white light.

According to the above-described light emitting element, even in a top-emission type element in which a light resonance structure is formed, white light having a low wavelength dispersion property can be acquired.

According to Application Example 9, there is provided a light emitting device having four types of light emitting elements including: a first light emitting element that emits red light; a second light emitting element that emits green light; a third light emitting element that emits blue light; and a fourth light emitting element that emits white light. Each of the four types of the light emitting elements has a plurality of organic material layers including at least a light emitting layer between a first electrode laminated through a reflective layer on a substrate and a second electrode formed of a translucent reflective material. In addition, a first organic material layer of the plurality of organic material layers included in the fourth light emitting element has a first layer thickness in a first sub region within a light emitting region that is defined by the first electrode, the second electrode, and the light emitting layer and has a second layer thickness that is different from the first layer thickness in a second sub region within the light emitting region.

According to the above-described light emitting device, a resonant length that is an optical distance between the reflective layer and the second electrode within the light emitting region can be changed in accordance with the layer thickness of the first organic material layer. Thus, when the same light emitting layer as that of the first to third light emitting elements is used, white light having a low wavelength dispersion property can be projected from the fourth light emitting element, and thereby the display quality of the light emitting device can be improved.

According to Application Example 10, in the above-described light emitting device, a change of the layer thickness of the first organic material layer is determined such that a wavelength distribution of light projected from the light emitting region by the fourth light emitting element is approximately the same as that of white light in a visible light region.

According to the above-described light emitting device, white light can be acquired without emission of the first to third light emitting elements, and accordingly, power consumption can be reduced.

According to Application Example 11, in the above-described light emitting device, the first sub region and the second sub region are formed in the shape of a stair within the light emitting region of the fourth light emitting element.

According to the above-described light emitting device, the first organic material layer can be formed by repeating a local film forming process, and accordingly, the resonant length can be set with excellent controllability.

According to Application Example 12, in the above-described light emitting device, the first organic material layer is a hole injection and transport layer that is formed between the first electrode and the light emitting layer, and a layer thicknesses of the hole injection and transport layer in the first to third light emitting elements are different from one another. In addition, the hole injection and transport layer of the fourth emitting element is acquired from dividing the light emitting region of the fourth light emitting element into three sub regions and forming hole injection and transport layers having the same layer thicknesses as those of the hole injection and transport layers of the first to third light emitting elements in the sub regions.

By setting the layer thickness of the hole injection and transport layer to different values for the first to third light emitting elements, the resonant lengths of the first to third light emitting elements can be changed, and accordingly, three types of projected light in which different wavelengths are enhanced by the first to third light emitting elements can be acquired. The light projected from the fourth light emitting element is a mixture of the three types of projected light, and accordingly, white light having a low wavelength dispersion property can be acquired without increasing the film forming process. As a result, a light emitting device having improved display quality with an increase in the manufacturing costs suppressed can be acquired.

According to Application Example 13, in the above-described light emitting device, the first organic material layer is an electron injection and transport layer formed between the second electrode and the light emitting layer, and a change of the layer thickness is acquired from dividing the light emitting region into three sub regions by the electron injection and transport layer of the fourth light emitting element and forming electron injection and transport layers having the same layer thicknesses as those of the electron injection and transport layers of the first to third light emitting elements in the sub regions.

By setting the layer thickness of the electron injection and transport layer to different values for the first to third light emitting elements, the resonant lengths of the first to third light emitting elements can be changed, and accordingly, three types of projected light in which different wavelengths are enhanced by the first to third light emitting elements can be acquired. The light projected from the fourth light emitting element is a mixture of the three types of projected light, and accordingly, white light having a low wavelength dispersion property can be acquired without increasing the film forming process. As a result, a light emitting device having improved display quality with an increase in the manufacturing costs suppressed can be acquired.

According to Application Example 14, in the above-described light emitting device, formation materials and layer thicknesses of layers pinched by the reflective layer and the second electrode except for the layer thickness of the first organic material layer are the same with one another in the four types of the light emitting elements.

According to the above-described light emitting device, light of appropriate wavelengths is projected from the first to third light emitting elements with a minimal increase in the process, and white light having a low wavelength dispersion property is projected from the fourth light emitting element. Accordingly, a light emitting device having improved display quality with the increase in the manufacturing costs more suppressed can be acquired.

According to Application Example 15, there is provided a light emitting device having four types of light emitting elements including: a first light emitting element that emits red light; a second light emitting element that emits green light; a third light emitting element that emits blue light; and a fourth light emitting element that emits white light. Each of the four types of the light emitting elements has a light emitting layer including at least two light emitting material layers between a first electrode laminated on a substrate through a reflective layer and a second electrode formed of a translucent reflective material which emit light of different wavelengths, and an optical resonance structure is formed between the reflective layer and the second electrode. In addition, light generated from the light emitting layer is projected from the light emitting region through the second electrode, and, in a part of the light emitting region of the fourth light emitting element, a middle layer formed of an organic material not having a light emitting function is formed between the light emitting material layers.

According to the above-described light emitting device, the resonant length can be changed without changing the layer thicknesses of other constituent elements configuring the light emitting element, and accordingly, projected light having a low wavelength dispersion property without deteriorating the luminance efficiency can be acquired. As a result, a light emitting device having improved display quality can be acquired.

According to Application Example 16, in the above-described light emitting device, the middle layer has a hole mobility and an electron mobility that are approximately equivalent to each other.

According to the above-described light emitting element, the resonant length can be changed without changing the light emitting characteristic of the light emitting layer, and accordingly, the degree of freedom for setting the resonant length is improved, and thereby projected light having a low wavelength dispersion property can be acquired in an easy manner. As a result, a light emitting device having more improved display quality can be acquired.

According to Application Example 17, in the above-described light emitting device, the middle layer has any one mobility between the hole mobility and the electron mobility that is higher than the other mobility.

According to the above-described light emitting element, a difference between the light emitting material layers constituting the light emitting layer can be formed, and accordingly, an effect of enhancing light of a specific wavelength and projected light having a lower wavelength dispersion property can be acquired. As a result, a light emitting device having much more improved display quality can be acquired.

According to Application Example 18, in the above-described light emitting device, allocation within the light emitting region of the fourth light emitting element between an area in which the middle layer is formed and an area in which the middle area is not formed is determined such that a wavelength distribution of light projected from the light emitting region by the fourth light emitting element is approximately the same as that of white light in a visible light range.

According to the above-described light emitting device, when the same light emitting layer as that of the first to third light emitting elements is used, white light having a low wavelength dispersion property can be projected from the fourth light emitting element, and thereby the display quality can be improved.

According to Application Example 19, in the above-described light emitting device, in at least one of the first to third light emitting elements, a middle layer having the same layer thickness as that of the middle layer formed in the fourth light emitting element is formed in the whole region of the light emitting region.

According to the above-described light emitting device, the resonant lengths of two types can be formed by using the first to third light emitting elements without increasing the number of processes, and projected light having different peak wavelengths can be acquired while using a common light emitting material layer. Accordingly, the display quality can be improved with the increase in the manufacturing costs reduced.

According to Application Example 20, in the above-described light emitting device, formation materials and layer thicknesses of layers pinched by the reflective layer and the second electrode area except for the formation area of the middle layer and the layer thickness of the middle layer are the same in the four types of the light emitting elements.

According to the above-described light emitting device, light of appropriate wavelengths is projected from the first to third light emitting elements with a minimal increase in the number of processes, and white light having a low wavelength dispersion property is projected from the fourth light emitting element. Accordingly, a light emitting device having improved display quality with the increase in the manufacturing costs more suppressed can be acquired.

According to Application Example 21, in the above-described light emitting element, a red color filter is disposed in the direction for emission of the first light emitting element, a green color filter is disposed in the direction for emission of the second light emitting element, and a blue color filter is disposed in the direction for emission of the third light emitting element.

According to the above-described light emitting device, projected light in which light of specific wavelengths is enhanced by the resonance can be configured to be closer to light of three primary colors. Accordingly, a light emitting device having more improved display quality can be acquired.

BRIEF DESCRIPTION OF THE DRAWINGS

The invention will be described with reference to the accompanying drawings, wherein like numbers reference like elements.

FIGS. 9A and 9B are cross-section views showing a process for an organic EL device according to a seventh embodiment of the invention.

FIGS. 10A and 10B are cross-section views showing a process for an organic EL device according to a seventh embodiment of the invention.

DESCRIPTION OF EXEMPLARY EMBODIMENTS

Figure 1:
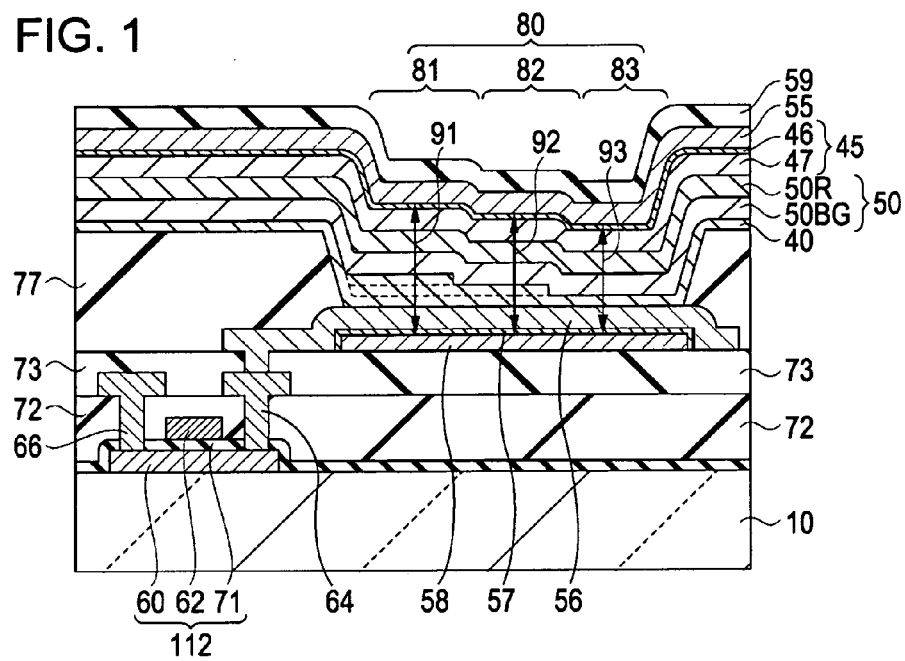
FIG. 1 is a schematic diagram of an organic EL element according to a first embodiment of the invention.

Hereinafter, as embodiments of the present invention, organic EL elements as light emitting elements and organic EL devices as light emitting devices that display an image by regularly disposing the organic EL elements in a display area will be described. In the drawings shown below, in order to set each constituent element to a size recognizable in the drawings, the size and proportion of each constituent element is appropriately represented to be different from the real size and proportion thereof.

Organic EL Element

Before organic EL elements according to the embodiments of the invention are described, first, an overview of an organic EL element will be described with reference to the accompanying drawings.

Figure 4:
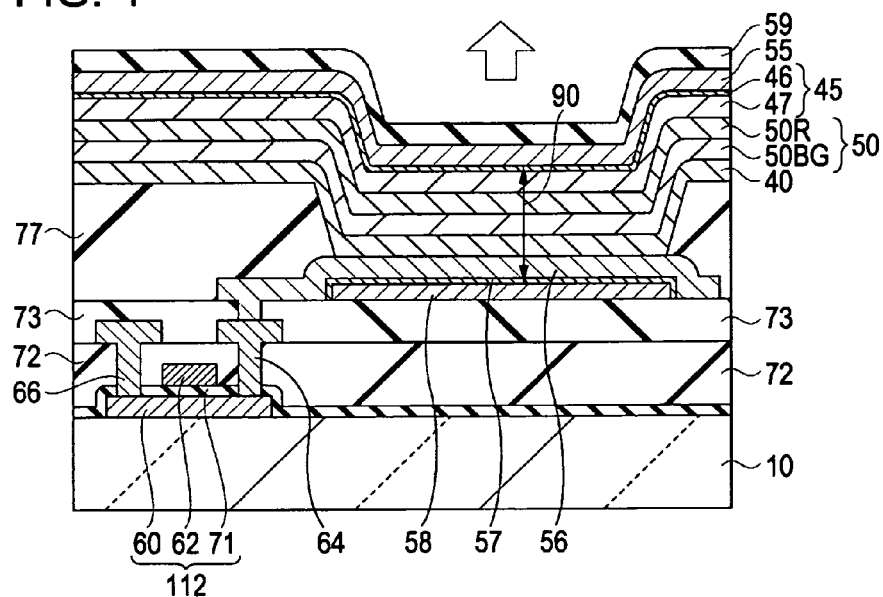
FIG. 4 is a schematic cross-section view of an organic EL element.

FIG. 4 is a schematic cross-section view showing the overview of an organic EL element emitting white light, which is common to the embodiments to be described later, together with a driving TFT (thin film transistor) 112 to be described later. The diagram is a schematic cross-section view of a top-emission-type organic EL element that emits light to a side (upside) opposite to a component substrate 10 in which components such as TFTs are formed. On the component substrate 10, a driving TFT 112 having a channel region 60 that is formed of a polycrystalline silicon layer, a gate insulation film 71 formed of silicon oxynitride or the like, and a gate electrode 62 formed of poly silicon, Al, or the like is formed. In addition, in the upper layer of the driving TFT, a second interlayer insulation film 72 formed of silicon oxynitride or the like is laminated. In addition, a drain electrode 64 and a source electrode 66 that are electrically connected to the channel region 60 are formed by selectively removing a part of the second interlayer insulation film 72.

In the upper layer of both the electrodes, a third interlayer insulation film 73 formed of silicon oxynitride or the like is laminated. On the third interlayer insulation film 73, a reflective layer 58 is formed, and an anode (hereinafter, referred to as an anode) 56 as a first electrode that is formed of a translucent conductive material such as ITO (indium oxide-tin alloy) is formed through a protection layer 57 so as to cover the reflective layer. The anode 56 is connected to the drain electrode 64 through a contact hole that is formed by selectively removing a part of the third interlayer insulation film 73. Accordingly, the anode 56 is electrically connected to the driving TFT 112, and thus a driving current supplied from a power supply line 106 (see FIG. 5) can be supplied to a light emitting layer 50 to be described later.

In the upper layer of the third interlayer insulation film 73 and the anode 56, an insulating organic material layer formed of polyimide or the like or an insulating inorganic material layer is patterned such that a region, which is overlapped with the reflective layer 58, of the anode 56 is exposed, and a partition wall 77 is formed. On the anode 56, a hole injection and transport layer 40, a cyan light emitting layer 50BG, a red light emitting layer 50R, an electron transport layer 47, an electron injection layer 46, a cathode (hereinafter, referred to as a cathode) 55 as a second electrode, and a sealing layer 59 are sequentially laminated. The electron transport layer 47 increases electron transport capability so as to improve luminance efficiency. In addition, the electron injection layer 46 increases the injection efficiency of electrons from the cathode 55 so as to improve the luminance efficiency.

A light emitting layer 50 is formed by laminating two types of light emitting material layers, that is, a cyan light emitting layer 50BG for emitting light having a wavelength that is in the approximate center between wavelengths of green light and blue light and a red light emitting layer 50R for emitting light having a wavelength close to red light. The light emitting layer 50 may be formed as a single material layer. However, in such a case, it is difficult to select a material for acquiring white light. Thus, generally, plural types of material layers are laminated so as to acquire appropriate white light, that is, light of which wavelength distribution (spectral distribution) is close to flat.

In the top-emission-type organic EL element, it is preferable that the cathode 55 is formed of a material having high translucency and conductivity. However, in view of a work function, it is difficult to use ITO or the like as the material of the cathode. Thus, by forming metal or alloy such as Al, Mg, or Ag, which has a small value of the work function, to have a film thickness equal to or smaller than about 10 nm, translucency of about 50%, that is, semi-translucency reflection is acquired with conductivity maintained.

When the cathode 55 has semi-translucency reflection, about a half of the light that is emitted from the light emitting layer 50 toward the cathode 55 is transmitted through the cathode 55 and is projected through the sealing layer 59. In addition, the other half of the light emitted toward the cathode 55 is reflected from the cathode 55 so as to progress toward the anode 56 side. In addition, the light reflected toward the anode 56 side is reflected from the reflective layer 58 that is formed in a lower layer of the anode 56 so as to progress toward the upper side. An about half of the reflected light is transmitted through the cathode 55 and is projected through the sealing layer 59. In addition, the other half of the reflective light is reflected from the cathode 55 so as to progress toward the anode 56 side again. The resonance is repetition of reflection of light emitted from the light emitting layer 50 between the cathode 55 and the anode 56, and thereby light of a specific wavelength is enhanced. In the top-emission-type organic EL element, a resonant structure having a resonant length 90 is inevitably formed between the reflective layer 58 and the cathode 55. Thus, light of a specific wavelength may be easily enhanced, and accordingly it is difficult to acquire appropriate white light. In the embodiments described below, by setting a plurality of resonant lengths 90 in one organic EL element, enhancement of light having only a specific wavelength caused by resonance is suppressed, and thereby appropriate white light is acquired.

First Embodiment

FIG. 1 shows a schematic cross-section view of an organic EL element according to a first embodiment of the invention. The figure is a schematic cross-section view of a top-emission-type organic EL element that emits white light. The figure is a cross-section view of the organic EL element together with a driving TFT 112 in a case where a surface perpendicular to a substrate is used as a cut surface. The organic EL element according to this embodiment basically has a same configuration as that of a general organic EL element shown in FIG. 4, except for the shape of a hole injection and transport layer 40. Thus, to each common constituent element, a same reference sign is assigned, and a description thereof is partly omitted here.

The organic EL element according to this embodiment is formed as a first organic material layer in which the layer thickness of the hole injection and transport layer 40 changes stepwise within the light emitting region 80 of the organic EL element. In other words, in the light emitting region 80, that is, an area surrounded by a partition wall 77, the hole injection and transport layer 40 is formed to have different layer thicknesses in a first sub region 81, a second sub region 82, and a third sub region 83. In particular, the layer thickness of the hole injection and transport layer 40 increases stepwise in order of the layer thickness in the third sub region 83, the layer thickness in the second sub region 82, and the layer thickness in the first sub region 81. The layer thicknesses of constituent elements other than the hole injection and transport layer 40, that is, an anode 56, a cyan light emitting layer 50BG, a red light emitting layer 50R, an electron transport layer 47, and an electron injection layer 46 that are sequentially laminated between the reflective layer 58 and the cathode 55 are fixed at least within the above-described light emitting region 80.

As described above, the resonant length of the organic EL element is an optical distance between the reflective layer 58 and the cathode 55. An optical distance of a layer formed of a same material is in proportion to the layer thickness. Thus, the resonant length within the light emitting region 80 changes to three levels including a first resonant length 91 that is the resonant length of the first sub region 81, a second resonant length 92 that is the resonant length of the second sub region 82, and a third resonant length 93 that is the resonant length of the third sub region 83, in descending order of the resonant length. Accordingly, the first sub region 81, the second sub region 82, and the third sub region 83 enhance light of different wavelengths due to resonance. Therefore, the organic EL element according to this embodiment has a top emission structure and can suppress enhancement of light having only a specific wavelength.

As described above, in the organic EL element according to this embodiment, the light emitting layer 50 is formed by laminating the cyan light emitting layer 50BG and the red light emitting layer 50R, and emits light of a wide wavelength distribution having two weak peaks. In addition, the above-described organic EL element projects the emitted light with the light in resonance, so that light of different wavelengths is enhanced in accordance with the resonant lengths that are changed stepwise. As a result, appropriate white light, that is, white light having a wavelength dispersion property lower than that of a general top-emission-type organic EL element can be acquired.

In the above-described first embodiment and other embodiments described below, emitted light represents light generated by an EL phenomenon in the light emitting layer 50. In addition, projected light represents light transmitted though the cathode 55 after the emitted light is resonant between the reflective layer 58 and the cathode 55, or light projected outside the organic EL device.

In addition, in FIG. 1, areas of the first, second, and third sub regions 81, 82, and 83 are shown to be approximate the same with one another. However, the areas are not limited thereto, and it is preferable that the areas are determined based on an optimal area ratio, that is an area ratio at which the projected light is close to the white light. In addition, the ratio of the layer thicknesses in the above-described three regions is not limited to 1:2:3. It is preferable that the ratio of the layer thicknesses is determined such that the projected light is close to the white light. In addition, enhancement of light of a specific wavelength can be further suppressed by dividing the light emitting region 80 into four or more sub regions and forming the hole injection and transport layer of different layer thicknesses in the sub regions.

Second Embodiment

Figure 2:
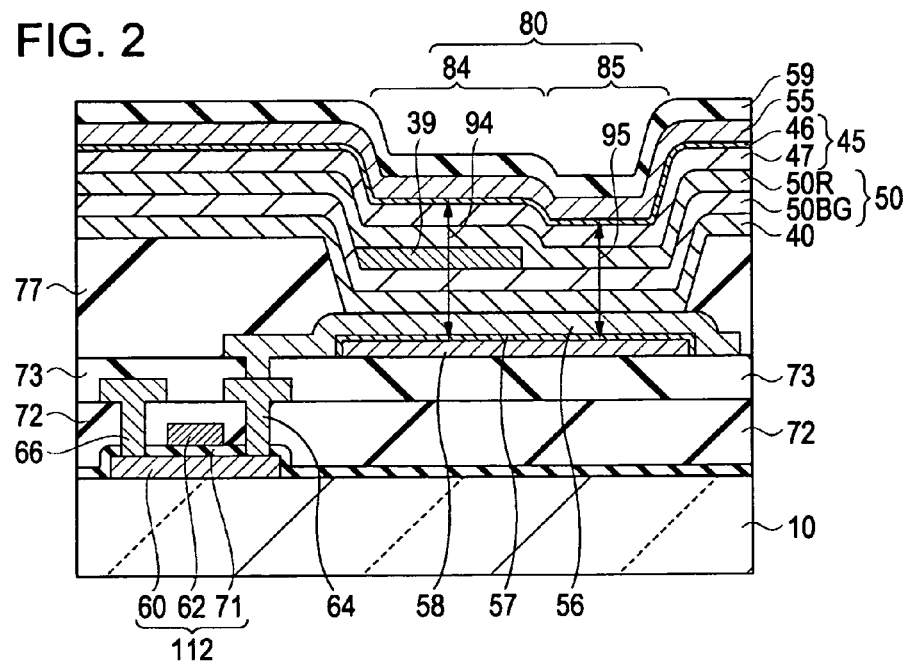
FIG. 2 is a schematic diagram of an organic EL element according to a second embodiment of the invention.

FIG. 2 shows a schematic cross-section view of a top-emission-type organic EL element according to a second embodiment of the invention which emits white light. The figure is a cross-section view of the organic EL element together with a driving TFT 112 in a case where a face perpendicular to a substrate is used as a cut surface. The organic EL element according to this embodiment basically has a same configuration as that of the first embodiment, thus a same reference sign is assigned to each common constituent element.

The organic EL element according to this embodiment uses a middle layer 39 as a first organic material layer of which layer thickness is changed stepwise within the light emitting region 80. The middle layer 39 is formed of a conductive organic material that does not have a light emitting function (EL function) and can adjust an optical distance between the cathode 55 and the reflective layer 58, that is, a resonant length without degrading the light emitting function. In the organic EL element according to this embodiment, the light emitting region 80 is divided into a fourth sub region 84 and a fifth sub region 85. The middle layer 39 is formed between the red light emitting layer 50R and the cyan light emitting layer 50BG in the fourth sub region 84. The fourth resonant length 94 that is a resonant length of the fourth sub region 84 is set to be larger than a fifth resonant length 95 that is the resonant length of the fifth sub region 85, due to the middle layer 39. As a result, in the above-described both regions, light of different wavelengths can be enhanced by resonance.

As described above, the light emitting layer 50 of the organic EL element according to this embodiment is formed by laminating the cyan light emitting layer 50BG and the red light emitting layer 50R that emits light, and thereby emitting light of a wide wavelength distribution having two weak peaks. In addition, the organic EL element according to this embodiment projects the emitted light with the light in resonance, so that light of different wavelengths is enhanced in the fourth sub region 84 and the fifth sub region 85. As a result, the organic EL element can project appropriate white light, compared to the general top-emission-type organic EL element, that is, an organic EL element having a same resonant length within the entire light emitting region 80.

In addition, by dividing the light emitting region 80 into three or more sub regions and forming a middle layer 39 having different layer thicknesses for each sub region, white light having much lower wavelength dispersion property can be acquired.

Here, the electrical property of the above-described middle layer 39 will be described. As described above, the middle layer 39 is a material layer that is used for adjusting the resonant length. In order to achieve the object, it is preferable that the middle layer 39 is formed of a material in which the hole mobility is approximately the same as the electron mobility. For a material having the above-described property, any arbitrary layer thickness can be set without affecting the function of the light emitting layer 50.

However, on the other hand, a method in which the function of the light emitting layer 50, more particularly, the color of the emitted light is positively affected by using a material having the hole mobility different from the electron mobility may be considered to be used. Since the middle layer 39 is disposed between the red light emitting layer 50R and the cyan light emitting layer 50BG, the middle layer 39 can control movement of the electrons and holes such that any one of the above-described light emitting layer emits light stronger than that from the other light emitting layer.

Third Embodiment

Figure 3:
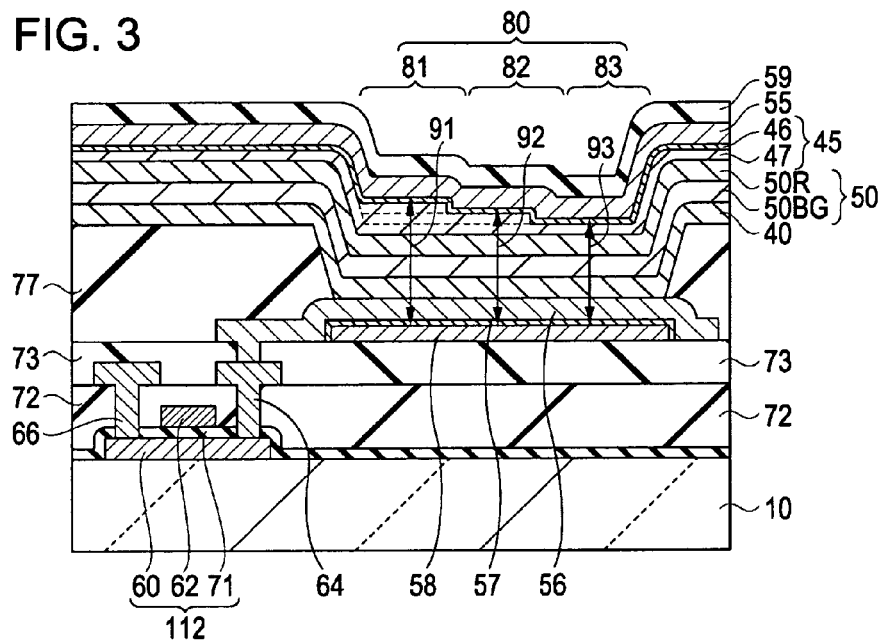
FIG. 3 is a schematic diagram of an organic EL element according to a third embodiment of the invention.

FIG. 3 shows a schematic cross-section view of a top-emission-type organic EL element according to a third embodiment of the invention which projects white light. The figure is a cross-section view of the organic EL element together with a driving TFT 112 in a case where a face perpendicular to a substrate is used as a cut surface. The organic EL element according to this embodiment basically has a same configuration as that of the first embodiment, thus a same reference sign is assigned to each common constituent element.

In the organic EL element according to this embodiment, an electron transport layer 47 is formed as a first organic material layer of which layer thickness is changed stepwise within a light emitting region 80. In other words, the electronic transport layer 47 is formed to have different thicknesses in a first sub region 81, a second sub region 82, and a third sub region 83 within the light emitting region 80. On the other hand, the layer thickness of each layer of constituent elements other than the electron transport layer 47, that is, an anode 56, a hole injection and transport layer 40, a cyan light emitting layer 50BG, a red light emitting layer 50R, and an electron injecting layer 46 that are sequentially laminated between a reflective layer 58 and a cathode 55 is fixed at least within the light emitting region 80.

The layer thickness of the electron transport layer 47 in the sub regions is formed gradually thicker in order of the layer thickness in the third sub region 83, the layer thickness in the second sub region 82, and the layer thickness in the first sub region 81. Accordingly, the resonant length within the light emitting region 80 is set as three levels of a first resonance length 91 that is a resonant length of the first sub region 81, a second resonance length 92 that is a resonant length of the second sub region 82, and a third resonance length 93 that is a resonant length of the third sub region 83, in descending order of the length. As a result, light of different wavelengths is enhanced due to resonance in the first sub region 81, the second sub region 82, and the third sub region 83.

As described above, the light emitting layer 50 of the organic EL element according to this embodiment is formed by laminating two layers of light emitting material layers and emits light of a broad wavelength distribution having two weak peaks. The organic EL element according to this embodiment enhances light of different wavelengths in the above-described three sub regions for the emitted light, and accordingly the organic EL element can project light of a wavelength distribution that is much closer to a flat distribution. As a result, the organic EL element according to this embodiment can suppress enhancement of light of a specific wavelength due to resonance, and accordingly, the organic EL element can project white light more appropriate than a general top-emission-type organic EL element, that is, white light of a low wavelength dispersion property.

In FIG. 3, the first sub region 81, the second sub region 82, and the third sub region 83 are shown to have an approximately same area. However, the area ratio is not limited thereto, and it is preferable that an optimal area ratio, that is, an area ratio for which the projected light is close to white light is used.

In addition, it is preferable that the layer thickness ratio of the electron transport layer 47 in the above-described three sub regions is determined to be an optimal layer thickness ratio, that is, a layer thickness ratio for which the projected light is close to white light.

Furthermore, enhancement of light of a specific wavelength can be more suppressed by dividing the light emitting region 80 into four or more sub regions and forming the electron transport layer 47 to have difference layer thicknesses in the sub regions.

Organic EL Device

Next, organic EL devices according to embodiments of the invention as light emitting devices will be described. Before the organic EL devices according to the embodiments are described, first, an overview of an organic EL device will be described with reference to the accompanying drawings.

Figure 5:
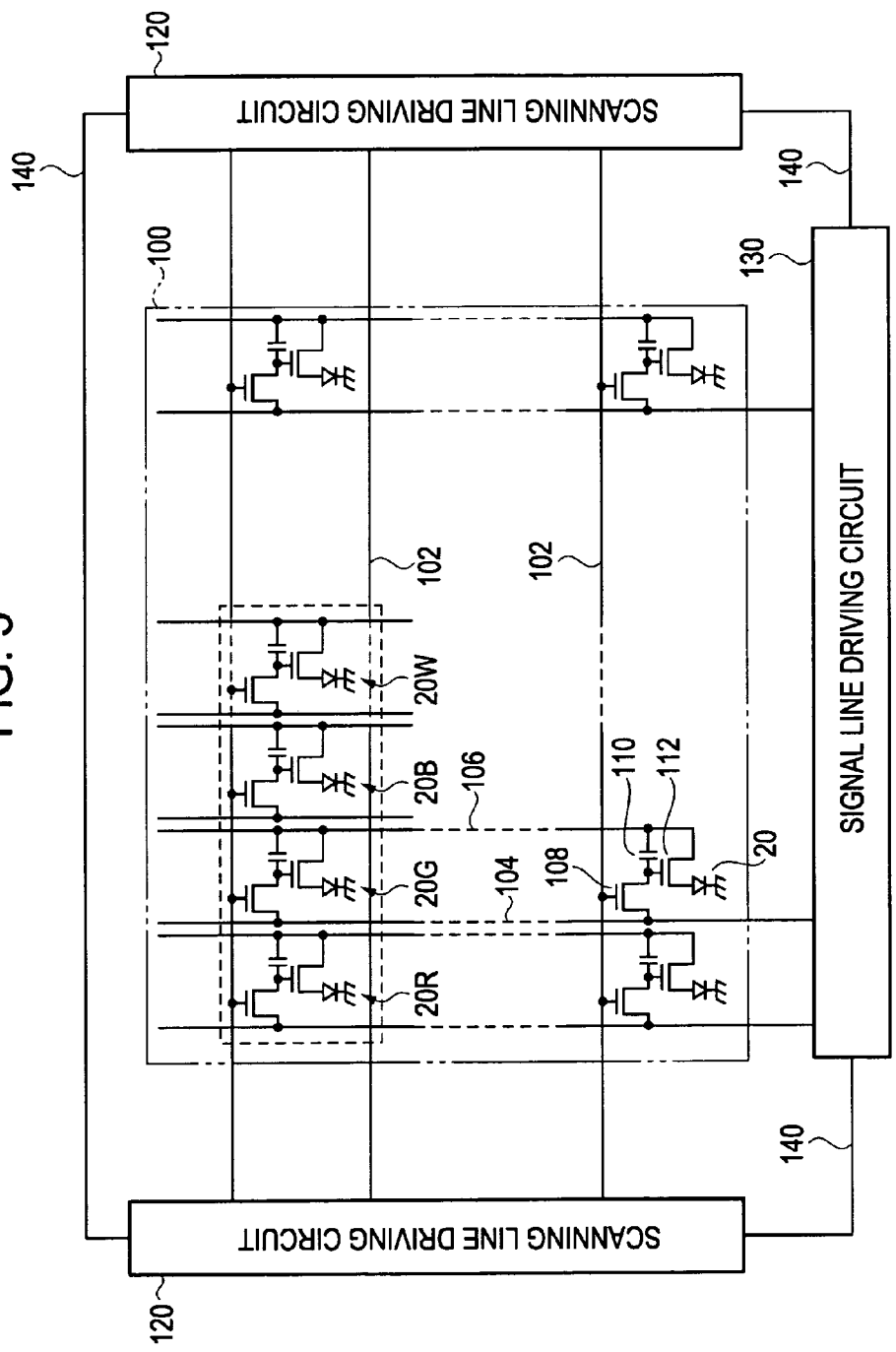
FIG. 5 is a circuit diagram showing the whole configuration of an organic EL device.

FIG. 5 is a circuit diagram showing the whole configuration of an organic EL device that is common to embodiments described below. In the figure, an active-matrix-type organic EL device that forms an image in a display area by individually controlling organic EL elements as light emitting elements disposed regularly is shown as an example.

In the display area 100, a plurality of scanning lines 102, a plurality of signal lines 104 that are perpendicular to the scanning lines 102, and a plurality of power supply lines 106 that are aligned parallel to the signal lines 104 are formed. A rectangular partition surrounded by the above-described three types of wirings is a pixel area.

In each pixel area, a switching TFT 108 having a gate electrode 62 to which a scanning signal is supplied through the scanning line 102, a retentive capacitor 110 that retains a pixel signal that is supplied from the signal line 104 through the switching TFT 108, a driving TFT 112 having a gate electrode 62 to which the pixel signal retained by the retentive capacitor 110 is supplied, and an organic EL element 20 in which a driving current flows from the power supply line 106 through the driving TFT 112 are formed. In the organic EL element 20, a light emitting layer 50 including a light emitting material layer is pinched by an anode 56 that is a pixel electrode and a cathode 55 that has a common electric potential over all the range of the image display area 100 (see FIG. 4), and the driving current is supplied to the anode 56.

In the periphery of the image display area 100, scanning line driving circuits 120 and a signal line driving circuit 130 are formed. To the scanning lines 102, scanning signals are sequentially supplied in accordance with various signals supplied from an external circuit not shown in the figure from the scanning line driving circuits 120. To the signal lines 104, image signals are supplied from the signal line driving circuit 130. To the power supply lines 106, pixel driving currents from an external circuit not shown in the figure are supplied. In addition, the operations of the scanning line driving circuits 120 and the operation of the signal line driving circuit 130 are in synchronization with each other by a synchronization signal that is supplied from an external circuit through a synchronization signal line 140.

When the scanning line 102 is driven so as to turn on the switching TFT 108, the electric potential of the signal line 104 at that moment is retained in the retentive capacitor 110, and the level of the driving TFT 112 is determined in accordance with the state of the retentive capacitor 110. Then, a driving current flows from the power supply line 106 to the anode 56 through the driving TFT 112, and the driving current flows in the cathode 55 through the organic material layer. As a result, the light emitting layer 50 emits light in accordance with the magnitude of the driving current.

A total of four types of the organic EL elements 20 including a first organic EL element 20R as a first light emitting element that emits red light, a second organic EL element 20G as a second light emitting element that emits green light, a third organic EL element 20B as a third light emitting element that emits blue light, and a fourth organic EL element 20W as a fourth light emitting element that emits white light are disposed regularly in the image display area 100. As described above, each organic EL element is independently controlled so as to emit light in accordance with the magnitude of the driving current, and accordingly, a color image is formed in the image display area 100.

The disposition order of the four types of the organic EL elements is not limited to the order of R, G, B, and W. Thus, for example, the organic EL elements may be disposed in order of R, B, G, and W. Furthermore, the sizes (planar sizes) of the four types of the organic EL elements are not limited to be the same with one another.

Fourth Embodiment

Figure 6:
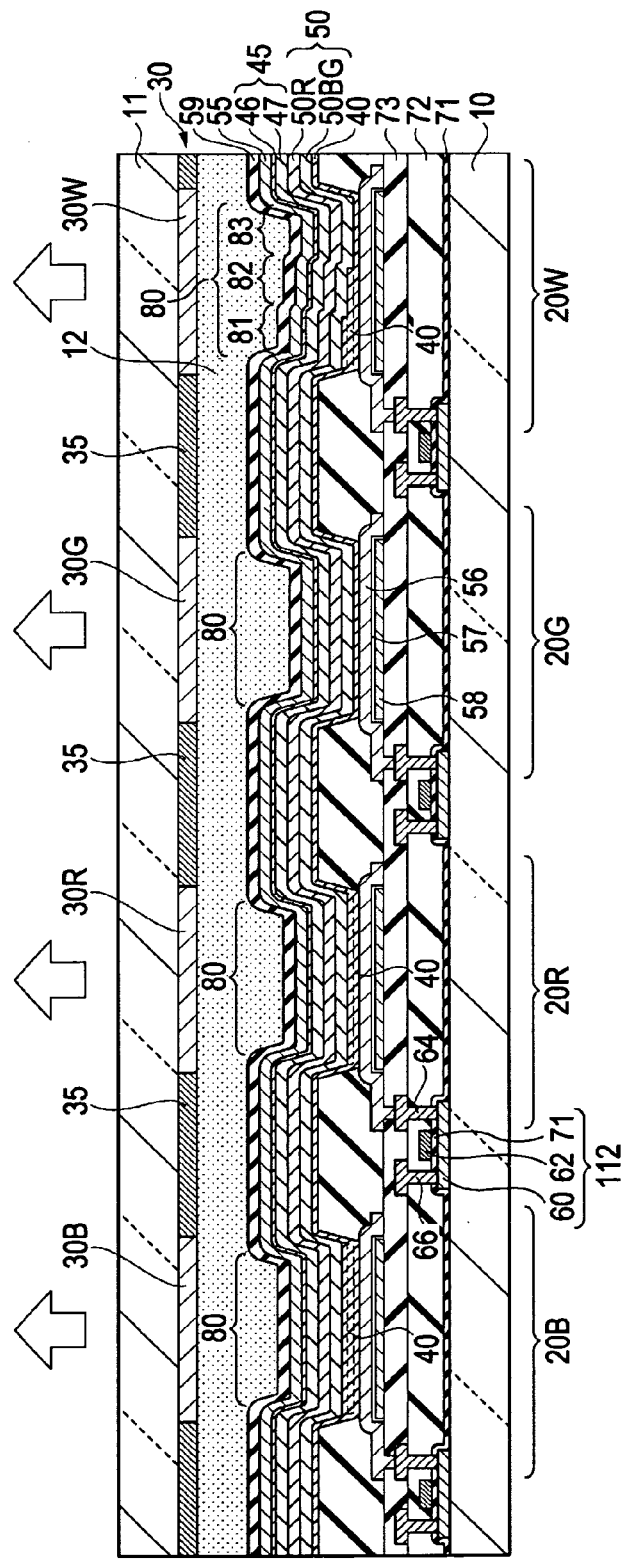
FIG. 6 is a schematic cross-section view of an organic EL device according to a fourth embodiment of the invention.

FIG. 6 is a schematic cross-section view of an organic EL device according to a fourth embodiment of the invention. The organic EL device is a top-emission-type organic EL device that emits light in the direction denoted by arrows shown in the figure. In the figure, four types of organic EL elements including a third organic EL element 20B that emits blue light, a first organic EL element 20R that emits red light, a second organic EL element 20G that emits green light, and a fourth organic EL element 20W that emits white light, which are formed regularly on a component substrate 10, are shown with driving TFTs 112 that drive the organic EL elements. In the figure, the switching TFTs 108 (see FIG. 5) and the like are omitted. The constituent elements that configure each organic EL element except for the hole injection and transport layer 40 are approximately the same as those of the general organic EL element shown in FIG. 4. In the figure, the electron injection layer 46 (see FIG. 4) and the electron transport layer 47 (see FIG. 4) are shown as an election injection and transport layer 45. This applies the same to FIGS. 7 to 10 shown below.

The component substrate 10 is bonded to a color filter substrate 11 having a color filter layer 30 formed on the surface thereof through an adhesive layer 12. In particular, a blue color filter 30B is bonded to the third organic EL element 20B such that the blue color filter faces the third organic EL element, a red color filter 30R is bonded to the first organic EL element 20R such that the red color filter faces the first organic EL element, and a green color filter 30G is bonded to the second organic EL element 20G such that the green color filter faces the second organic EL element. As described later, in the organic EL device according to this embodiment and organic EL device according to fifth and sixth embodiments, at least two types of projected light by using the light emitting layer 50 formed of a same light emitting material layer can be acquired. By passing the projected light through each color filter, light of an optimal wavelength, that is, light close to light of three primary colors can be acquired. In addition, the color filter of each color is partitioned by a black matrix 35. A white color filter 30W facing the fourth organic EL element 20W is formed of a colorless and transparent material such as a acrylic resin and passes light projected from the fourth organic EL element 20W without changing the wavelength and the like thereof.

The organic EL device according to this embodiment uses the organic EL element according to the first embodiment as the fourth organic EL element 20W. Accordingly, the organic EL device according to this embodiment has the first organic material layer in which the layer thickness of the hole injection and transport layer 40 is changed stepwise within the light emitting region 80 of the fourth organic EL element 20W. In other words, the hole injection and transport layer 40 is formed to have different thicknesses in the first sub region 81, the second sub region 82, and the third sub region 83. In addition, the layer thickness of the hole injection and transport layer 40 differs for each organic EL element. In particular, the layer thicknesses of the hole injection and transport layers 40 of the third organic EL element 20B, the first organic EL element 20R, and the second organic EL element 20G are different from one another.

The layers (constituent elements) other than the hole injection and transport layer 40, that is, the anode 56, the cathode 55, and the layer pinched by both the electrodes have the same layer thicknesses and formation materials as those of the general organic EL element. Only the layer thickness of the hole injection and transport layer 40 is different from that of the general organic EL, and the hole injection and transport layer 40 is formed of a same material as that of the general organic EL element.

The formation material and the layer thickness of each layer are as follow. A reflective layer 58 is formed of Al, and an anode 56 is formed of ITO. A total of layer thicknesses of the reflective layer 58 and the anode 56 is 130 nm. In addition, between the reflective layer 58 and the anode 56, a protection layer 57 made of silicon nitride having a layer thickness of 50 nm is formed.

As the formation material of a cyan light emitting layer 50BG that forms the light emitting layer 50, BH215 made by Idemitsu Kosan Co., Ltd. is used as a host material that assures conductivity, and BD102 made by Idemitsu Kosan Co., Ltd. which represents cyan light emission as a dopant that has a function for emitting light by combining electrons and holes is added thereto. The layer thickness of the cyan light emitting layer 50BG is 40 nm.

As the formation material of the red light emitting layer 50R, BH215 made by Idemitsu Kosan Co., Ltd. is used as a host material, and RD001 made by Idemitsu Kosan Co., Ltd. which represents red light emission as a dopant is added thereto. The layer thickness of the red light emitting layer 50R is 5 µm.

In addition, BD102 emits light having a wavelength in the range of 450 nm to 550 nm. The color of light of this wavelength is generally referred as sky-blue. However, in descriptions here, in order to use a name of the color of the light that is common to the name of the color used in the color filter or the like, this color of the light is referred to as cyan. Similarly, although the color of light having a wavelength in the range of 550 nm to 700 nm which is emitted from RD001 is generally referred to as orange, the color of the light is referred to as red in descriptions here. In addition, in descriptions here, light having a wavelength distribution slightly different from a color may be referred by the name of the color. For example, there is a case where light having a decreased wavelength distribution resulting from transmission of the above-described red light having a wavelength in the range of 550 nm to 700 nm through a color filter is referred to as red light.

An electron transport layer 47 is formed of Alq3 (aluminum quinolinol) having a layer thickness of 20 nm. An electron injection layer 46 is formed of LiF (Lithium Fluoride) having a layer thickness of 1 nm. A cathode 55 is formed of Al having a layer thickness of 5 nm. In addition, a sealing layer 59 is formed of silicon oxide having a layer thickness of 200 nm.

The hole injection and transport layer 40 as the first organic material layer is formed by laminating HI406 (made by Idemitsu Kosan Co., Ltd.) as a hole injection layer and HT320 (made by Idemitsu Kosan Co., Ltd.) as a hole transport layer. The layer thickness of the hole injection transport layer 40 (the hole injection layer and the hole transport layer) differs for each organic EL element. In particular, the layer thickness of the hole injection transport layer 40 is 120 nm (the hole injection layer is 100 nm, and the hole transport layer is 20 µm) in the third organic EL element 203, the layer thickness of the hole injection transport layer 40 is 60 nm (the hole injection layer is 40 µm, and the hole transport layer is 20 nm) in the first organic EL element 20R, and the layer thickness of the hole injection transport layer 40 is 25 nm (the hole injection layer is 10 nm, and the hole transport layer is 15 nm) in the second organic EL element 20G.

The layer thickness of the hole injection and transport layer 40 (the hole injection layer and the hole transport layer) is determined such that projected light optimized for the above-described three types of the organic EL elements can be acquired. In other words, light of predetermined wavelengths is enhanced by using the light emitting layer 50 formed of same material layers and setting a predetermined resonant length for each organic EL element, and accordingly projected light having wavelengths close to the three primary colors of red, green, and blue is acquired.

In the light emitting region 80 of the fourth organic EL element 20W, a hole injection and transport layer 40 as the first organic material layer having a stepped (discontinuous) different layer thickness in accordance with its position (within the light emitting region) is formed by combining the above-described hole injection and transport layers 40 having three types of layer thicknesses. In particular, the layer thickness of the hole injection and transport layer 40 is 120 nm in the first sub region 81 (see FIG. 1, hereinafter) is 120 nm, which is the same as the layer thickness of the third organic EL element 20B, the layer thickness of the hole injection and transport layer 40 is 60 nm in the second sub region 82, which is the same as the layer thickness of the first organic EL element 20R, and the layer thickness of the hole injection and transport layer 40 is 25 nm in the third sub region 83, which is the same as the layer thickness of the second organic EL element 20G. The layer thicknesses of layers other than the hole injection and transport layer 40 are the same in the above-described sub regions within the light emitting region 80. Thus, for each sub region, that is, the first sub region 81, the second sub region 82, and the third sub region 83, different resonant lengths (optical distances between the cathode 55 and the reflective layer 58) are set. Accordingly, light of different wavelengths is enhanced in each sub region.

As described above, the layer thicknesses of the hole injection and transport layers 40 of the first to third organic EL elements are set such that light of wavelengths close to those of the three primary colors can be projected. Accordingly, projected light of the fourth organic EL element 20W that combines the hole injection and transport layer 40 having the above-described layer thickness becomes light that includes all the wavelengths close to the three primary colors of red, green, and blue and has a low wavelength dispersion property, that is, appropriate white light. In addition, light projected from the first to third organic EL elements becomes appropriate light closer to that of the three primary colors by being transmitted through the color filter layer 30. The light projected from the fourth organic EL element 20W is transmitted through the colorless and transparent white color filter 30W so as to be projected as white light. Accordingly, the organic EL device according to this embodiment includes organic EL elements of which constituent elements other than the hole injection and transport layer 40 are configured to have a common material and a same layer thickness and can project appropriate light of the three primary colors and appropriate white light, and accordingly, can display a color image with an improved quality. In addition, power consumption, particularly, for a case where white light is heavily used can be reduced. The area ratio of the above-described sub regions within the light emitting region 80 can be arbitrary set.

Figure 11A:
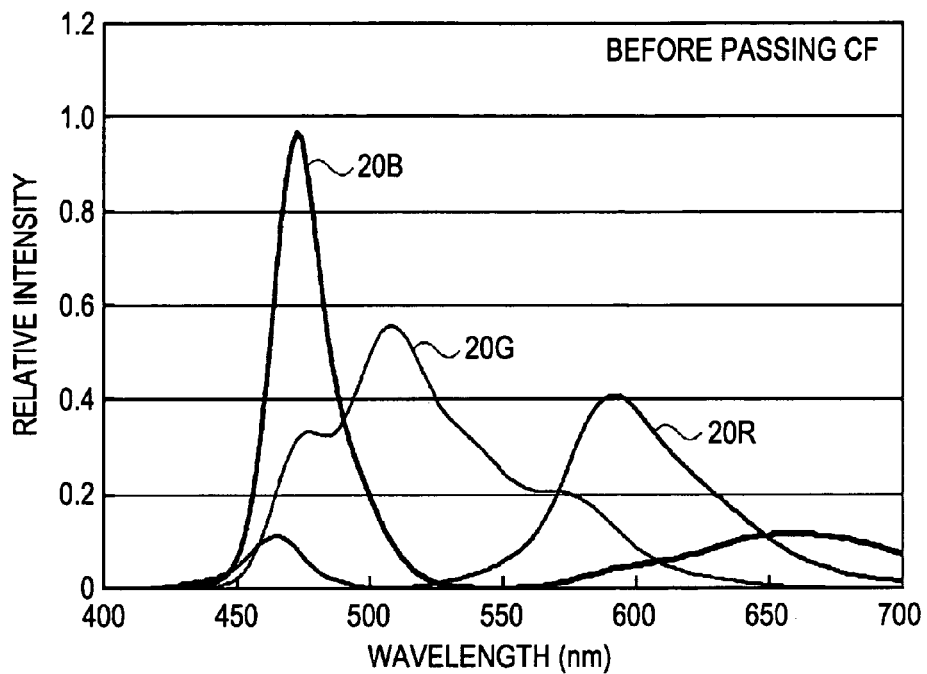
FIGS. 11A and 11B are diagrams showing an effect of a first organic material layer according to a fourth embodiment of the invention.
Figure 11B:
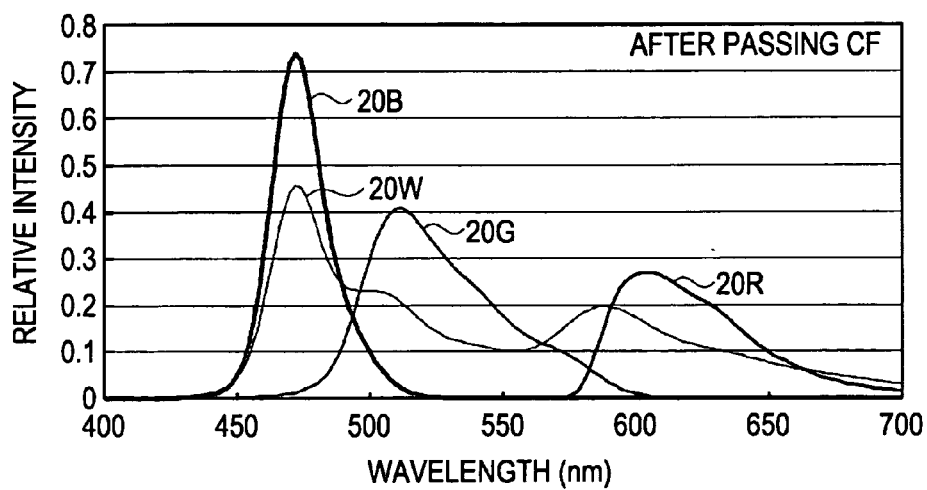

In FIGS. 11A and 11B, an effect of this embodiment, that is, a case where the layer thickness of the hole injection and transport layer 40 as the first organic material layer is changed among the first to third organic EL elements each projecting light of one of the three primary colors and within the light emitting region 80 of the fourth organic EL element 20W that projects white light is shown. In addition, within the light emitting region 80 of the fourth organic EL element 20W, the area ratio of the first to third sub regions within the light emitting region 80 is 1:1:1, that is, the light emitting region is equally divided into three sub regions.

FIG. 11A shows wavelength distributions of projected light of the first to third organic EL elements 20R, 20G, and 20B before the projected light is transmitted through the color filter layer 30. By setting the resonant lengths to appropriate values by changing the layer thickness of the hole injection and transport layer 40, three types of projected light having remarkably different peak wavelengths can be acquired with the same light emitting layer 50 used. However, since the range of the three primary colors is about 600 nm to 700 nm for red light, about 500 nm to 600 nm for green light, and about 450 nm to 480 nm for blue light, the projected light leans toward the short wavelength side from the appropriate range of wavelengths on the whole. Thus, an appropriate color image cannot be formed under this state.

FIG. 11B shows wavelength distributions of projected light of the first to third organic EL elements and projected light of the fourth organic EL element 20W that projects white light, after the projected light is transmitted through the color filter layer 30. Since the white light is transmitted though a colorless and transparent layer formed of acryl or the like, light of a specific wavelength is not enhanced. Accordingly, the waveform is close to that of the projected light of the first to third organic EL elements before being transmitted through the color filter layer 30 is proportionally distributed in accordance with the area ratio of the first to third sub regions within the light emitting region 80. As described above, since the wavelength distributions shown in the figure sets the area ratio to 1:1:1 for three equal divisions, approximately appropriate white light is acquired. Furthermore, by setting the area ratio more appropriately, more appropriate white light can be acquired. In addition, the light projected from the first to third organic EL elements includes specific wavelengths more enhanced by the color filter layer 30, and accordingly appropriate light of the three primary colors is acquired. Accordingly, although constituent elements of four types of organic EL elements, which are regularly disposed, other than the hole injection and transport layers 40 are configured to use a same material and have a same layer thickness, the top-emission-type organic EL device according to this embodiment can project appropriate light of three primary colors and appropriate white light, and accordingly, a color image with an improved quality can be displayed. In addition, power consumption, particularly for a case where white light is heavily used can be reduced.

Fifth Embodiment

Figure 7:
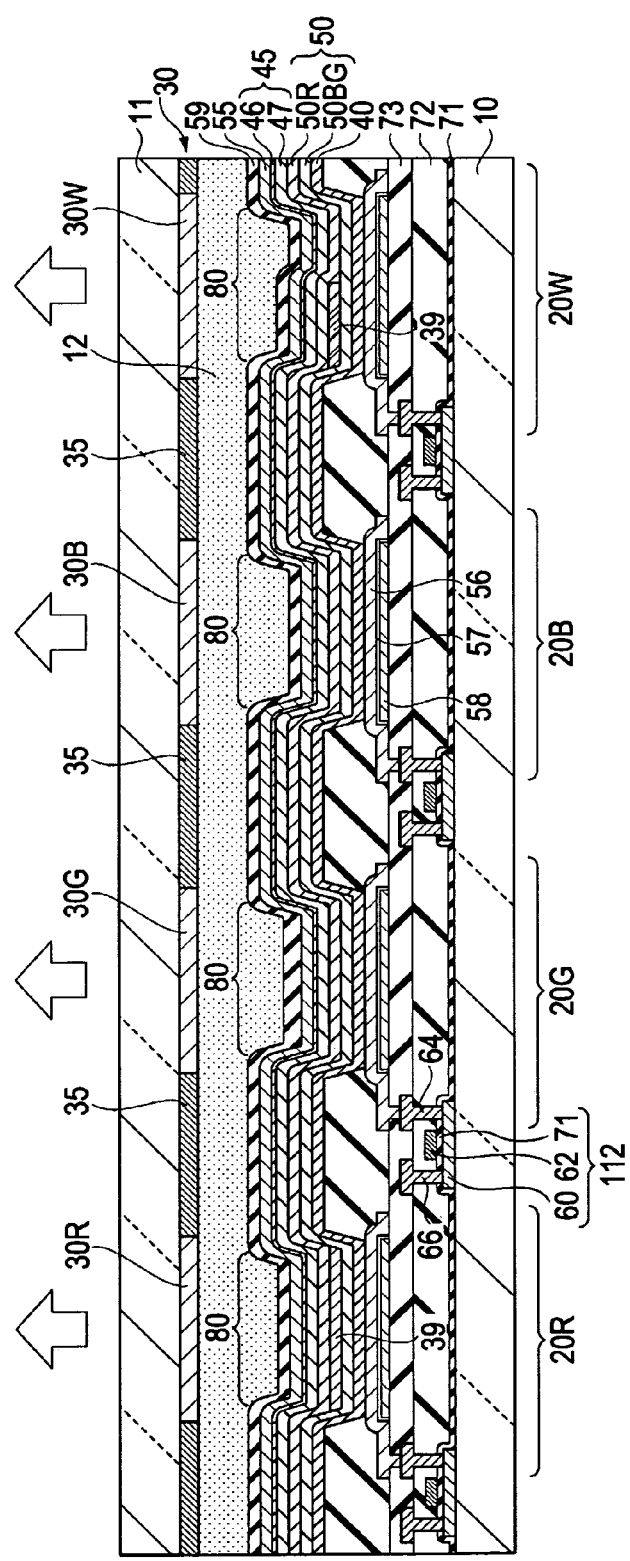
FIG. 7 is a schematic cross-section view of an organic EL device according to a fifth embodiment of the invention.

FIG. 7 is a schematic cross-section view of an organic EL device according to a fifth embodiment of the invention. The organic EL device is a top-emission-type organic EL device that emits light in the direction denoted by arrows shown in the figure. The organic EL device has a configuration similar to that according to the fourth embodiment, and thus, a same reference sign is assigned to each common constituent element. However, the organic EL device has disposition order different from that according to the fourth embodiment.

The organic EL device according to this embodiment uses a middle layer 39 formed of an organic material that does not have a light emitting function (EL function), as a first organic material layer that has the layer thickness changed stepwise within the light emitting region 80, which is different from the organic EL device according to the fourth embodiment.

A fourth organic EL device 20W of the organic EL device according to this embodiment is similar to that according to the second embodiment. The fourth organic EL device 20W includes a middle layer 39 between a cyan light emitting layer 50BG and the red light emitting layer 50R in a part of an area within the light emitting region 80. The middle layer 39 is also formed in the light emitting region 80 (the whole light emitting region) of a first organic EL device 20R. By utilizing an effect acquired by controlling transport capability of charges more than an effect acquired by changing the resonance length, projected light having a different wavelength distribution is acquired from the same light emitting layer.

The middle layer 39 does not have a light emitting function and is formed of an organic material that has hole transport capability and low electron transport capability. In this embodiment, the middle layer 39 is formed of a formation material of a hole transport layer included in a hole injection and transport layer 40, that is, HT320 (made by Idemitsu Kosan Co., Ltd.). The layer thickness of the middle layer 39 is 20 nm in both the first organic EL element 20R and the fourth organic EL element 20W.

The layer thicknesses and formation materials of layers other than the middle layer 39 are as follow. A reflective layer 58 is formed of Al, and in an upper layer thereof, a protection layer 57 formed of silicon nitride having a layer thickness of 50 nm is formed. An anode 56 is formed of ITO having a layer thickness of 30 nm. A hole injection and transport layer 40 is formed by laminating HI406 (made by Idemitsu Kosan Co., Ltd.) having a layer thickness of 60 nm as a hole injection layer and HT320 (made by Idemitsu Kosan Co., Ltd.) having a layer thickness of 20 nm as a hole transport layer. A light emitting layer 50 is configured by a cyan light emitting layer 50BG and a red light emitting layer 5R. The formation materials of the cyan light emitting layer 50BG and the red light emitting layer 50R are the same as those of the fourth embodiment, and BH215 made by Idemitsu Kosan Co., Ltd. is used as a host material. To the host material, BD102 made by Idemitsu Kosan Co., Ltd. as a dopant is added in the cyan light emitting layer 50BG, and RD001 made by Idemitsu Kosan Co., Ltd. as a dopant is added in the red light emitting layer 50R. The layer thickness of the cyan light emitting layer 50BG, 40 nm, and the layer thickness of the red light emitting layer 50R is 5 nm. An electron transport layer 47 formed of Alq3 (aluminum quinolinol) having a layer thickness of 20 nm. An electron injection layer 46 is formed of LiF (Lithium Fluoride) having a layer thickness of 1 nm. A cathode 55 is formed of Al having a layer thickness of 5 nm. In addition, a sealing layer 59 is formed of silicon oxide having a layer thickness of 200 μm.

The middle layer 39 performs a function described below within the light emitting layer 50 of the first organic EL element 20R. Generally, an anode, a light emitting layer (including plural types of material layers), and a cathode are laminated in the light emitting region of the organic EL element, and holes supplied from the anode and electrons supplied from the cathode are combined in the light emitting layer for emitting light. The above-described three elements are laminated in the first organic EL device 20R in order of the anode 56, the cyan light emitting layer 50BG, the middle layer 39, the red light emitting layer 50R, and the cathode 55.

As described above, the middle layer 39 is formed of a same material as that of the hole transport layer. The middle layer 39 has high hole transport capability and low electron transport capability. Accordingly, electrons supplied from the cathode 55 rarely arrive at the cyan light emitting layer 50BG. To the contrary, holes supplied from the anode 56 pass through the middle layer 39 and arrive at the red light emitting layer 50R. Consequently, although the first organic EL element 20R has the cyan light emitting layer 50BG and the red light emitting layer 50R within the light emitting region 80, combination of electrons and holes occurs only in the red light emitting layer 50R, and thereby the first organic EL element 20R generates light having a wavelength distribution close to that of the red light. By determining the layer thickness of the middle layer 39 such that an optical distance between the reflective layer 58 and the cathode 55 which includes the middle layer enhances red light, the above-described wavelength distribution becomes close to that of appropriate red light.

On the other hand, since the second organic EL element 20G and the third organic EL element 203 do not have a middle layer 39 formed inside the light emitting layer 50, combination of electrons and holes occurs in both the cyan light emitting layer 50G and the red light emitting layer 50R. Generally, since there is a high occurrence ratio of the above-described combination in a boundary face between the anode and the light emitting layer inside the light emitting layer, mainly the cyan light emitting layer 50BG emits light inside the light emitting layers 50 of the second organic EL element 200 and the third organic EL element 20B. As a result, light that has a peak in the range of 450 nm to 550 nm and does not include much light of a wavelength exceeding 550 nm, that is, cyan light (sky-blue light) is generated. As described above, both the organic EL elements of the organic EL device according to this embodiment are formed of a same material and have a same layer thickness, and accordingly, the light emitting layers 50 of both the organic EL elements (the second and third organic EL elements) emit the same light.

In the organic EL device according to this embodiment, similarly to the organic EL device according to the fourth embodiment, a red color filter 30R is bonded to the first organic EL element 20R such that the red color filter faces the first organic EL element, a green color filter 30G is bonded to the second organic EL element 20G such that the green color filter faces the second organic EL element, and a blue color filter 30B is bonded to the third organic EL element 20B such that the blue color filter faces the third organic EL element, whereby light of corresponding wavelengths is enhanced. Thus, the cyan light is projected as green light from the second organic EL element 20G and is projected as blue light from the third organic EL element 20B. Similarly, light projected from the first organic EL element 20R becomes closer to more appropriate red light due to the red color filter 30R.

By the above-described operations, the organic EL device according to this embodiment can acquire light of three primary colors, that is, projected light of colors including a red color, a green color, and a blue color from three types of the organic EL elements that are configured by constituent elements formed of a same material and having a same layer thickness, except for existence of the middle layer 39.

In addition, the fourth organic EL element 20W projects white light on the whole by mixing the above-described two types of light, that is, red light emitted from a region in which the middle layer 39 is formed and cyan light emitted from a region in which the middle layer 39 is not formed, at an appropriate ratio. In the fourth organic EL element 20W, the area ratio of the region in which the middle layer 39 is formed to the region in which the middle layer 39 is not formed may be arbitrarily set such that appropriate white light, that is, white light having a low wavelength dispersion property is acquired. Thus, the layer thickness of the middle layer 39 may be set with primarily focused on approaching the projected light from the first organic EL element 20R before passing the color filter layer 30 to read light.

Figure 12A:
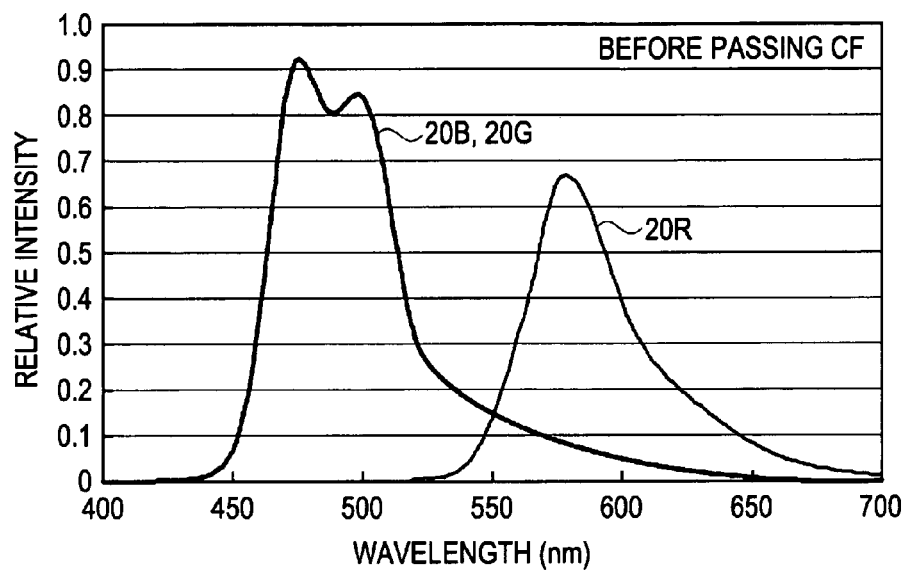
FIGS. 12A and 12B are diagrams showing an effect of a first organic material layer according to a fifth embodiment of the invention.
Figure 12B:
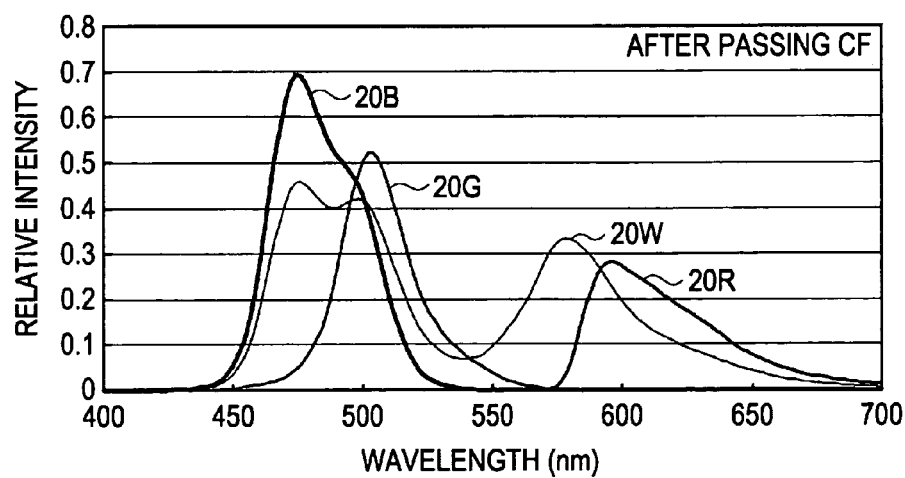

FIGS. 12A and 12B show an effect according to this embodiment, that is, an effect acquired from forming the middle layer 39 within the light emitting region 80 as the first organic material layer. The area ratio of the fourth organic EL element 20W within the light emitting region 80 is set to 1:1.

FIG. 12A shows wavelength distributions of projected light of the first organic EL element 20R before passing the color filter layer 30 and projected light of the second organic EL element 20G and the third organic EL element 20B before passing the color filter layer 30. As described above, before passing the color filter layer 30, the projected light of the second organic EL element 20G and the projected light of the third organic EL element 20B are the same, and thus, they are represented by a common line.

The projected light of the first organic EL element 20R has a wavelength distribution close to red light by an effect acquired from forming the middle layer 39 between the cyan light emitting layer 50BG and the red light emitting layer 50R and suppressing light emission of the cyan light emitting layer 50BG. However, similarly to the above-described fourth embodiment, the wavelength distribution of the projected light of the first organic EL element 20R leans to the short wavelength side from the appropriate range of wavelengths.

Since the red light emitting layer 50R emits light to some degree in addition to the cyan light emitting layer 50BG, the projected light of the second organic EL element 20G and the third organic EL element 20B becomes light that has a peak near 500 nm and a relatively broad wavelength distribution.

FIG. 12B shows wavelength distributions of the first to third organic EL elements 20R, 20G, and 20B after passing the color filter layer 30 and projected light of the fourth organic EL element 20W that emits white light. Since the white light is transmitted through a colorless and transparent layer formed of acryl or the like, a specific wavelength is not enhanced. Accordingly, the white light has a waveform close to a waveform acquired from proportionally distributing two wavelength distribution curves shown in FIG. 12A at a ratio of 1:1, and thereby appropriate white light is acquired. Furthermore, by setting the area ratio more appropriately, more appropriate white light can be acquired. In addition, light projected from the first to third organic EL elements becomes more appropriate (three primary color) light as the light of specific wavelengths is more enhanced by the color filter layer 30.

Accordingly, although four types of organic EL elements, which are regularly disposed, other than the middle layer 39 are configured to use a same material and have a same layer thickness, the top-emission-type organic EL device according to this embodiment can project appropriate three primary color light and white light, and accordingly, the organic EL device can display a color image with an improved quality and reduce power consumption, particularly in a case where the white light is heavily used.

Sixth Embodiment

Figure 8:
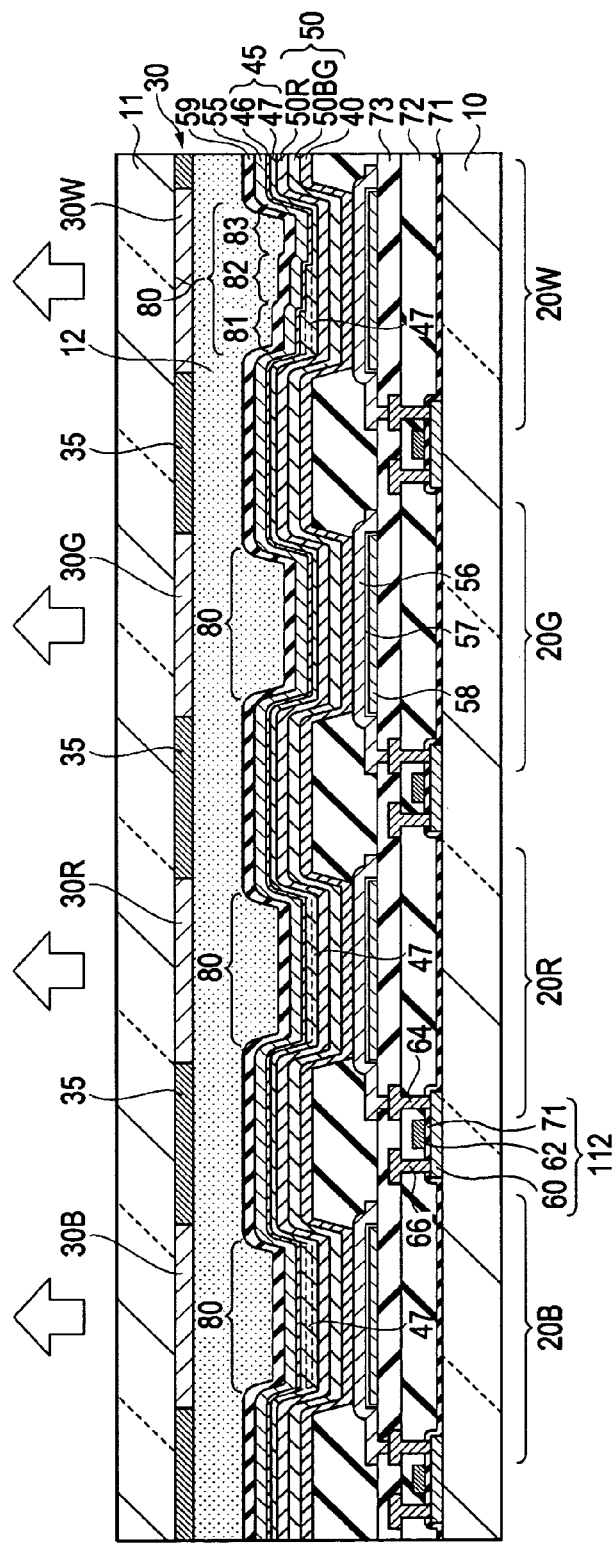
FIG. 8 is a schematic cross-section view of an organic EL device according to a sixth embodiment of the invention.

FIG. 8 is a schematic cross-section view of an organic EL device according to a sixth embodiment of the invention. The organic EL device is a top-emission-type organic EL device that emits light in the direction denoted by arrows shown in the figure. Basically, the organic EL device has a same configuration as that according to the fourth embodiment, and thus, a same reference sign is assigned to each common constituent element.

In the organic EL device according to this embodiment, the organic EL device according to the above-described third embodiment is used as a fourth organic EL element 20W.

Accordingly, in the organic EL device according to this embodiment, an electronic transport layer 47 is used as a first organic material layer, and the layer thickness of the transport layer 47 is changed stepwise within a light emitting region 80 of the fourth organic EL element 20W. In particular, the electronic transport layer 47 is formed to have different thicknesses in a first sub region 81, a second sub region 82, and a third sub region 83. In addition, the layer thicknesses of the electron transport layer 47 are different among different organic EL elements, that is, a third organic EL element 20B, a first organic EL element 20R, and a second organic EL element 20G. The layer thicknesses and formation materials of layers (constituent elements) other than the electron transport layer 47, that is, an anode 56, a cathode 55, and layers pinched by both the electrodes are the same among the above-described three types of the organic EL elements and the fourth organic EL element 20W.

The formation materials of the layers are as follow. A reflective layer 58 is formed of Al, and in an upper layer thereof, a protection layer 57 formed of silicon nitride having a layer thickness of 50 nm is formed. The anode 56 is formed of ITO having a layer thickness of 60 nm. A hole injection and transport layer 40 is formed by laminating HI406 (made by Idemitsu Kosan Co., Ltd.) having a layer thickness of 60 nm as a hole injection layer and HT320 (made by Idemitsu Kosan Co., Ltd.) having a layer thickness of 20 nm as a hole transport layer.

A light emitting layer 50 is configured by a cyan light emitting layer 50BG and a red light emitting layer 50R. The formation materials of the cyan light emitting layer 50BG and the red light emitting layer 50R are the same as those of the fourth or fifth embodiment, and BH215 made by Idemitsu Kosan Co., Ltd. is used as a host material. To the host material, BD102 made by Idemitsu Kosan Co., Ltd. as a dopant is added in the cyan light emitting layer 50GB, and RD001 made by Idemitsu Kosan Co., Ltd. as a dopant is added in the red light emitting layer 50R. The layer thickness of the cyan light emitting layer 50BS is 30 nm, and the layer thickness of the red light emitting layer 50R is 10 nm. An electron injection layer 46 is formed of LiF Lithium Fluoride) having a layer thickness of 1 nm. The cathode 55 is formed of Al having a layer thickness of 5 nm. In addition, a sealing layer 59 is formed of silicon oxide having a layer thickness of 200 nm.

The formation material of the electron transport layer 47 is Alq3 (aluminum quinolinol), and is the same for four types of the organic EL elements. However, the layer thickness of the electron transport layer 47 is different for each organic EL element. In particular, the layer thickness of the electron transport layer 47 is 110 nm in the third organic EL element 20B, is 45 nm in the first organic EL element 20R, and is 15 nm in the second organic EL element 20G. The layer thicknesses are determined such that optimal projected light can be acquired from the three types of the organic EL elements. In other words, light of predetermined wavelengths is enhanced by using the light emitting layer 50 formed of same material layers and setting a predetermined resonant length for each organic EL element, and accordingly projected light having wavelengths close to the three primary colors of red, green, and blue is acquired.

The electronic transport layer 47 of the fourth organic EL element 20W is formed by combining the layer thicknesses of the three types within the light emitting region 80. In particular, an Alq3 (aluminum quinolinol) layer is formed in the first sub region 81 to have a same layer thickness of 110 nm as that of the third organic EL element 20B, formed in the second sub region 82 to have a same layer thickness of 45 nm as that of the first organic EL element 20R, and formed in the third sub region 83 to have a same layer thickness of 15 nm as that of the second organic EL element 20G. In addition, the electron transport layer 47 having a different layer thickness in accordance with a position within the light emitting region 80 is formed. Accordingly, different resonant lengths are set in the above-described three sub regions. Thus, light of different wavelengths, particularly, light of wavelengths close to those of three primary colors including red, green, and blue colors can be enhanced in the sub regions. In this embodiment, the area ratio of the above-described three sub regions (the first sub region 81, the second sub region 82, and the third sub region 83) is 1:1:1. However, the area ratio is not limited thereto. In order to acquire appropriate white light, any arbitrary area ratio may be set.

As described above, the layer thickness of the electron transport layer 47 for the first to third organic EL elements is set to project light of wavelengths close to three primary colors. Accordingly, the fourth organic EL element 20W having the electron transport layer 47 of the above-described three layer thicknesses can project light that includes all the wavelengths close to those of the three primary colors of red, green, and blue colors and has a low wavelength dispersion property, that is, appropriate white light. Then, the light projected from the first to third organic EL elements is transmitted through the color filter layer 30 so as to be light having a wavelength characteristic more appropriate for the three primary colors, and thereby an appropriate image can be provided to an observer through the color filter substrate 11.

Figure 13A:
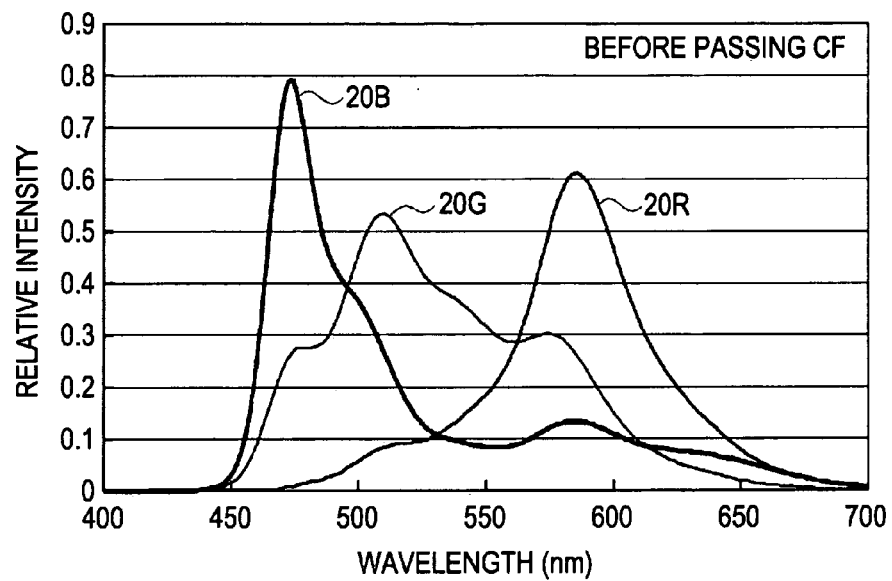
FIGS. 13A and 13B are diagrams showing an effect of a first organic material layer according to a sixth embodiment of the invention.
Figure 13B:
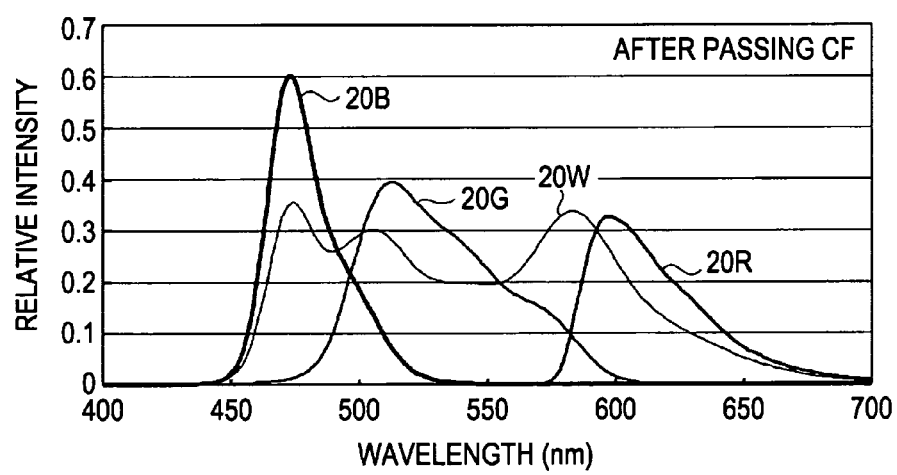

In FIGS. 13A and 13B, an effect of this embodiment, that is, a case where the layer thickness of the electronic transport layer 47 as the first organic material layer is changed within the light emitting regions 80 of the first to third organic EL elements 20R, 20G, and 20B that project light of one of the three primary colors and the fourth organic EL element 20W that projects white light is shown.

FIG. 13A shows wavelength distributions of projected light of the first to third organic EL elements 20R, 20G, and 20B before transmission through the color filter layer 30. By setting the resonant lengths to appropriate values by changing the layer thickness of the electronic transport layer 47, three types of projected light that uses the light emitting layers 50 formed of a same material and have remarkably different peak wavelengths can be acquired. However, since the range of the three primary colors is about 600 nm to 700 nm for red light, about 500 nm to 600 nm for green light, and about 450 nm to 480 nm for blue light, the projected light leans toward the short wavelength side from the range of the appropriate wavelengths on the whole. Thus, an appropriate color image cannot be formed in this state.

FIG. 13B shows wavelength distributions of projected light of the first to third organic EL elements after the projected light is transmitted through the color filter layer 30 and projected light of the fourth organic EL element 20W that projects white light. Since the white light is transmitted though the colorless and transparent layer, a specific wavelength is not enhanced. Accordingly, the waveform is close to that of the projected light of the first to third organic EL element before passing through the color filter layer 30 is proportionally distributed in accordance with the area ratio of the first to third sub regions within the light emitting region 80. As described above, although the area ratio is 1:1:1, however, more appropriate white light can be acquired by setting the area ratio more appropriately.

In addition, the light projected from the first to third organic EL elements is appropriate light of three primary colors by further enhancing light of specific wavelengths by using the color filter layer 30.

As a result, although constituent elements of four types of organic EL elements, which are regularly disposed, other than the electron transport layer 47 are configured to use a same material and have a same layer thickness, the top-emission-type organic EL device according to this embodiment can project appropriate light of the three primary colors and white light, and accordingly, a color image with an improved quality can be displayed. In addition, power consumption for a case where white light is heavily used can be reduced.

The electron transport layer 47 as the first organic material layer according to this embodiment, similarly to the first organic material layer according to above-described other embodiments, is formed by using a physical mask. In such a case, there is an advantage that the electronic transport layer 47 that has excellent adhesion of a physical mask and high precision of the layer thickness can be formed for installing the physical mask to the component substrate 10 after formation of constituent elements such as the hole injection and transport layer 40 and the like on the component substrate 10.

Seventh Embodiment

FIGS. 9A and 9B and FIGS. 10A and 10B show a hole injection and transport layer 40 forming process for the organic EL device according to the fourth embodiment, as a seventh embodiment of the invention. A same reference symbol is assigned to each element corresponding to a constituent element of the organic EL device according to the fourth embodiment shown in FIG. 6. As described above, although a hole injection layer and a hole transport layer are laminated so as to form the hole injection and transport layer 40, in this embodiment, for the convenience of description, it is assumed that the hole injection and transport layer 40 is formed of a single material layer.

First, as shown in FIG. 9A, in an area including at least an image display area 100 (see FIG. 5) on a component substrate 10 on which a driving TFT 112, a reflective layer 58, an anode 56, and the like are formed, the hole injection and transport layer 40 is formed. The formation of the hole injection and transport layer 40 is performed by using a vapor deposition method. This process is a first vapor deposition process. The layer thickness of the hole injection and transport layer 40 in the above-described process is 25 nm, which is the layer thickness of a hole injection and transport layer of a second organic EL element 20G.

Next, as shown in FIG. 9B, a hole injection and transport layer material 18 is laminated by using a vapor deposition method in a state that the component substrate 10 is covered with a first physical mask 15 formed of a metal material such as stainless steel. This process is a second vapor deposition process for the hole injection and transport layer. Parts of the first physical mask 15 which faces a light emitting region 80 of a first organic EL element 20R, a light emitting region 80 of a third organic EL element 20B, and first and second sub regions 81 and 82 within the light emitting region 80 of a fourth organic EL element 20W are formed as opening parts 17. Although FIG. 9B shows a gap between the first physical mask 15 and the component substrate 10 for the convenience of drawing, in an actual film forming process, the first physical mask 15 is brought into contact with the component substrate 10. A level difference formed by a partition wall 77 is minute, and the first physical mask 15 is formed of a very thin-plate shaped member. Thus, the first physical mask 15 can be brought into contact with the component substrate 10 such that the hole injection and transport layer material 18 is not vapor-deposited in areas not in contact with the opening parts 17 by applying pressure. Accordingly, only in areas facing the above-described opening parts 17, the hole injection and transport layer material 18 is vapor-deposited to be added to the hole injection and transport layer material 18 that has been vapor-deposited in the prior process, and thereby the layer thickness of the hole injection and transport layer 40 increases. In addition, the layer thickness of the hole injection and transport layer 40 that is vapor-deposited in the second vapor-deposition process is 35 nm, which is a difference between 60 nm that is the layer thickness of the hole injection and transport layer of the first organic EL element 20R and 25 nm that is layer thickness of the hole injection and transport layer of the second organic EL element 20G.

Next, as shown in FIG. 10A, a hole injection and transport material 18 is laminated by using a vapor-deposition method in a state that the component substrate 10 is covered with a second physical mask 16. This process is a third vapor deposition process for the hole injection and transport layer. Parts of the second physical mask 16 which face the light emitting region 80 of the third organic EL element 20B and the first sub region 81 of the light emitting region 80 of the fourth organic EL device 20W are opening parts 17. Similar to the second vapor-deposition process, the third deposition process is performed by bring the second physical mask 16 into contact with the component substrate 10, and accordingly, the hole injection and transport material 18 can be vapor-deposited only in areas facing the opening parts 17. In addition, as in the second vapor-deposition process, the deposited hole injection and transport material is added to the hole injection and transport layer material 18 that has been vapor-deposited in the prior process, and thereby the layer thickness of the hole injection and transport layer 40 increases. In addition, the layer thickness of the hole injection and transport layer 40 that is vapor-deposited in the third vapor-deposition process is 60 nm, which is a difference between 120 nm that is the layer thickness of the hole injection and transport layer of the third organic EL element 20B and 60 nm that is the layer thickness of the hole injection and transport layer of the first organic EL element 20R.

Finally, as shown in FIG. 10B, a cyan light emitting layer 50BG is formed by vapor-depositing a cyan light emitting material 19 in an area including at least the image display area 100 (see FIG. 5) on the component substrate 10. Then, after the above-described process is performed, a red light emitting layer 50R and the like are sequentially laminated so as to complete the component substrate 10. Then, the component substrate 10 is bonded to the color filter substrate 11 (see FIG. 6) through the adhesive layer 12 (see FIG. 6) for forming the organic EL device.

According to the processes of this embodiment, an organic EL device in which three types of organic EL elements each ejecting one of three primary colors have the hole injection and transport layers 40 of different layer thicknesses and an organic EL element projecting white light includes the hole injection and transport layer 40 that has a different layer thickness depending on a position (area) within the light emitting region 80 can be formed by adding only two vapor-deposition processes.

As described above in the fourth embodiment, the layer thickness of the hole injection and transport layer 40 of each of the three-type organic EL elements is set so as to form a resonant length for enhancing light of one of wavelengths of three primary colors. As a result, while constituent elements other than the hole injection and transport layers 40, including the light emitting layers 50 are formed to be the same, light close to the three primary colors can be projected. In addition, by combining the three types of layer thicknesses of the hole injection and transport layers 40 at an appropriate area ratio, the fourth organic EL element 20W that is used for projecting white light can project white light having a low wavelength dispersion property.

MODIFIED EXAMPLE 1

In the above-described embodiments, a top-emission type organic EL element and a top-emission type organic EL device that project light from a side opposite to the surface, that is, the component substrate 10 have been described. However, the technical idea of the present invention can be applied to a bottom-emission type organic EL element and a bottom-emission type organic EL device. In such a case, although the aperture ratio decreases, however, there is an advantage that the cathode 55 can be formed to be thick so as to reduce resistance.

MODIFIED EXAMPLE 2

In the above-described embodiments, the layer thickness of the first organic material layer of the organic EL element projecting white light is configured to be changed to two to three steps. However, the number of the steps of the change is not limited thereto, and may be set as a large value. In such a case, although costs needed for forming the organic EL element increase, much more appropriate white light, that is, projected light having a much more flat wavelength distribution can be acquired.

Furthermore, the layer thickness may be changed continuously other than stepwise so as to acquire projected light having a much more flat wavelength distribution.

The entire disclosure of Japanese Patent Application No. 2007-214450, filed Aug. 21, 2007 is expressly incorporated by reference herein.

What is claimed is:
1. A light emitting element comprising:
   a substrate;
   a first light emitting element being disposed above the substrate and emitting a white light in a first light emitting region; and
   a second light emitting element being disposed above the substrate and emitting a red light in a second light emitting region,
   a third light emitting element being disposed above the substrate and emitting a blue light in a third light emitting region,
   a fourth light emitting element being disposed above the substrate and emitting a green light in a fourth light emitting region,
   the first light emitting element including:
      a first reflective layer disposed above the substrate;
      a first anode electrode disposed above the first reflective layer;
      an organic layer that includes at least a light emitting layer disposed above the first anode electrode; and
      a cathode electrode disposed above the organic layer and having translucent reflectivity;
   the second light emitting element including:
      a second reflective layer disposed above the substrate;
      a second anode electrode disposed above the second reflective layer;
      the organic layer disposed above the second anode electrode; and the cathode electrode disposed above the organic layer;
the third light emitting element including:
- a third reflective layer disposed above the substrate;
- a third anode electrode disposed above the third reflective layer;
- the organic layer disposed above the third anode electrode; and
- the cathode electrode disposed above the organic layer;

the fourth light emitting element including:
- a fourth reflective layer disposed above the substrate;
- a fourth anode electrode disposed above the fourth reflective layer;
- the organic layer disposed above the fourth anode electrode; and
- the cathode electrode disposed above the organic layer;
- the organic layer that has a first portion in which the first light emitting element is positioned, a second portion in which the second light emitting element is positioned, a third portion in which the third light emitting element is positioned, and a fourth portion in which the fourth light emitting element is positioned, the first portion of the organic layer having a first thickness in a first region within the first light emitting region, a second thickness in a second region within the first light emitting region, the second region being different from the first region, and a third thickness in a third region within the first light emitting region, the third region being different from the first region and the second region, and the second portion of the organic layer consisting of the first thickness, the third portion of the organic layer consisting of the second thickness, and the fourth portion of the organic layer consisting of the third thickness.

2. The light emitting element according to claim 1, wherein the light emitting layer includes a hole injection and transport layer.

3. The light emitting element according to claim 1, wherein the light emitting layer is an electron injection and transport layer.

4. The light emitting element according to claim 1,
wherein the light emitting layer is an electron injection and transport layer, and
wherein a change of the layer thickness of the light emitting layer in the first light emitting region is acquired by forming electron injection and transport layers having the first thickness and the second thickness equal to layer thicknesses of the electron injection and transport layers of the second light emitting region.

5. The light emitting device according to claim 1, wherein the light emitting layer comprises the same formation materials in the first light emitting region and the second light emitting region.

* * * * *